(12) United States Patent
Kimura et al.

(10) Patent No.: US 12,007,656 B2
(45) Date of Patent: Jun. 11, 2024

(54) DISPLAY DEVICE

(71) Applicant: Semiconductor Energy Laboratory Co., Ltd., Atsugi (JP)

(72) Inventors: Hajime Kimura, Atsugi (JP); Atsushi Umezaki, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/980,674

(22) Filed: Nov. 4, 2022

(65) Prior Publication Data

US 2023/0058628 A1    Feb. 23, 2023

Related U.S. Application Data

(60) Continuation of application No. 17/488,398, filed on Sep. 29, 2021, now Pat. No. 11,500,254, which is a
(Continued)

(30) Foreign Application Priority Data

Feb. 11, 2010    (JP) ................... 2010-028285

(51) Int. Cl.
*G02F 1/1362*    (2006.01)
*G02F 1/1368*    (2006.01)
(Continued)

(52) U.S. Cl.
CPC .... *G02F 1/13624* (2013.01); *G02F 1/136259* (2013.01); *G02F 1/136286* (2013.01);
(Continued)

(58) Field of Classification Search
CPC ............. G02F 1/133345; G02F 1/1339; G02F 1/134309; G02F 1/13439; G02F 1/13624;
(Continued)

(56) References Cited

U.S. PATENT DOCUMENTS 5,337,172 A    8/1994    Lehureau
5,348,898 A    9/1994    Yatsuda et al.
(Continued)

FOREIGN PATENT DOCUMENTS

EP    0895220 A    2/1999
EP    1209748 A    5/2002
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Dmitriy Bolotin
(74) *Attorney, Agent, or Firm* — Eric J. Robinson; Robinson Intellectual Property Law Office, P.C.

(57) ABSTRACT

An object is to provide a display device that performs accurate display. A circuit is formed using a transistor that includes an oxide semiconductor and has a low off-state current. A precharge circuit or an inspection circuit is formed in addition to a pixel circuit. The off-state current is low because the oxide semiconductor is used. Thus, it is not likely that a signal or voltage is leaked in the precharge circuit or the inspection circuit to cause defective display. As a result, a display device that performs accurate display can be provided.

3 Claims, 17 Drawing Sheets

Related U.S. Application Data continuation of application No. 16/925,535, filed on Jul. 10, 2020, now Pat. No. 11,143,925, which is a continuation of application No. 15/991,170, filed on May 29, 2018, now Pat. No. 10,718,986, which is a continuation of application No. 15/711,029, filed on Sep. 21, 2017, now Pat. No. 10,007,160, which is a division of application No. 15/262,611, filed on Sep. 12, 2016, now Pat. No. 9,798,211, which is a continuation of application No. 14/602,876, filed on Jan. 22, 2015, now Pat. No. 9,465,271, which is a continuation of application No. 13/021,955, filed on Feb. 7, 2011, now Pat. No. 8,947,337.

(51) Int. Cl.

| | | |
|---|---|---|
| *G09G 3/00* | (2006.01) | |
| *G09G 3/36* | (2006.01) | |
| *H01L 27/12* | (2006.01) | |
| *H01L 29/786* | (2006.01) | |
| *G02F 1/1333* | (2006.01) | |
| *G02F 1/1339* | (2006.01) | |
| *G02F 1/1343* | (2006.01) | |
| *G02F 1/167* | (2019.01) | |
| *H01L 29/423* | (2006.01) | |

(52) U.S. Cl.
CPC ............ *G02F 1/1368* (2013.01); *G09G 3/006* (2013.01); *G09G 3/3648* (2013.01); *H01L 27/1225* (2013.01); *H01L 27/124* (2013.01); *H01L 27/1255* (2013.01); *H01L 29/7869* (2013.01); *G02F 1/133302* (2021.01); *G02F 1/133345* (2013.01); *G02F 1/1339* (2013.01); *G02F 1/134309* (2013.01); *G02F 1/13439* (2013.01); *G02F 1/136254* (2021.01); *G02F 1/167* (2013.01); *G09G 2230/00* (2013.01); *G09G 2310/0251* (2013.01); *H01L 29/42384* (2013.01)

(58) Field of Classification Search
CPC ......... G02F 1/136259; G02F 1/136286; G02F 1/1368; G02F 1/167; G02F 1/133302; G02F 1/136254; G09G 2230/00; G09G 2310/0251; G09G 3/006; G09G 3/3648; H01L 27/1225; H01L 27/124; H01L 27/1255; H01L 29/42384; H01L 29/7869
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,281,700 B1 | 8/2001 | Matsueda |
| 6,294,274 B1 | 9/2001 | Kawazoe et al. |
| 6,330,044 B1 | 12/2001 | Murade |
| 6,404,414 B2 | 6/2002 | Ishii |
| 6,493,047 B2 | 12/2002 | Ha |
| 6,525,556 B2 | 2/2003 | Matsueda |
| 6,563,174 B2 | 5/2003 | Kawasaki et al. |
| 6,624,857 B1 | 9/2003 | Nagata et al. |
| 6,670,944 B1 | 12/2003 | Ishii |
| 6,704,068 B2 | 3/2004 | Murade |
| 6,727,522 B1 | 4/2004 | Kawasaki et al. |
| 6,784,862 B2 | 8/2004 | Kodate et al. |
| 6,794,892 B2 | 9/2004 | Matsueda |
| 6,853,364 B2 | 2/2005 | Kai et al. |
| 6,882,378 B2 | 4/2005 | Nagata et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,312,624 B2 | 12/2007 | Ishii |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,505,020 B2 | 3/2009 | Yamamoto et al. |
| 7,570,072 B2 | 8/2009 | Hata et al. |
| 7,674,650 B2 | 3/2010 | Akimoto et al. |
| 7,732,819 B2 | 6/2010 | Akimoto et al. |
| 7,863,611 B2 | 1/2011 | Abe et al. |
| 7,910,490 B2 | 3/2011 | Akimoto et al. |
| 7,932,521 B2 | 4/2011 | Akimoto et al. |
| 7,932,886 B2 | 4/2011 | Higashi |
| 7,940,244 B2 | 5/2011 | Higashi |
| 7,968,383 B2 | 6/2011 | Honda et al. |
| 7,994,500 B2 | 8/2011 | Kim et al. |
| 7,998,372 B2 | 8/2011 | Yano et al. |
| 8,017,513 B2 | 9/2011 | Jeong et al. |
| 8,274,077 B2 | 9/2012 | Akimoto et al. |
| 8,324,920 B2 | 12/2012 | Hata et al. |
| 8,330,691 B2 | 12/2012 | Tanimoto et al. |
| 8,455,371 B2 | 6/2013 | Yano et al. |
| 8,466,463 B2 | 6/2013 | Akimoto et al. |
| 8,502,217 B2 | 8/2013 | Sato et al. |
| 8,513,662 B2 | 8/2013 | Yabuta et al. |
| 8,541,258 B2 | 9/2013 | Kim et al. |
| 8,629,069 B2 | 1/2014 | Akimoto et al. |
| 8,659,016 B2 | 2/2014 | Kim et al. |
| 8,669,550 B2 | 3/2014 | Akimoto et al. |
| 8,785,240 B2 | 7/2014 | Watanabe |
| 8,790,959 B2 | 7/2014 | Akimoto et al. |
| 8,796,069 B2 | 8/2014 | Akimoto et al. |
| 8,796,679 B2 | 8/2014 | Jeong et al. |
| 8,947,337 B2 | 2/2015 | Kimura et al. |
| 8,962,457 B2 | 2/2015 | Watanabe |
| 9,099,562 B2 | 8/2015 | Akimoto et al. |
| 9,136,338 B2 | 9/2015 | Yano et al. |
| 9,465,271 B2 | 10/2016 | Kimura et al. |
| 9,798,211 B2 * | 10/2017 | Kimura ............... G09G 3/3648 |
| 10,007,160 B2 | 6/2018 | Kimura et al. |
| 10,718,986 B2 * | 7/2020 | Kimura ............... G02F 1/1368 |
| 11,143,925 B2 * | 10/2021 | Kimura ............... H01L 27/1255 |
| 11,201,394 B2 | 12/2021 | Jia |
| 2001/0019384 A1 | 9/2001 | Murade |
| 2001/0030722 A1 | 10/2001 | Murade |
| 2001/0046027 A1 | 11/2001 | Tai et al. |
| 2002/0018152 A1 | 2/2002 | Nagata et al. |
| 2002/0056838 A1 | 5/2002 | Ogawa |
| 2002/0057251 A1 | 5/2002 | Higashi |
| 2002/0132454 A1 | 9/2002 | Ohtsu et al. |
| 2003/0098708 A1 * | 5/2003 | Matsueda ............ G09G 3/3648 |
| | | 324/760.01 |
| 2003/0151587 A1 | 8/2003 | Yamashita |
| 2003/0189401 A1 | 10/2003 | Kido et al. |
| 2003/0218222 A1 | 11/2003 | Wager, III et al. |
| 2003/0218594 A1 | 11/2003 | Ishii |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0024081 A1 | 2/2005 | Kuo et al. |
| 2005/0068310 A1 | 3/2005 | Ishii |
| 2005/0146349 A1 | 7/2005 | Lai et al. |
| 2005/0156830 A1 * | 7/2005 | Tobita .................... G09G 3/32 |
| | | 345/76 |
| 2005/0199959 A1 | 9/2005 | Chiang et al. |
| 2005/0258427 A1 | 11/2005 | Chan et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |

(56) References Cited

U.S. PATENT DOCUMENTS

| | | |
|---|---|---|
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0262075 A1 | 11/2006 | Higashi |
| 2006/0279510 A1 | 12/2006 | Lai |
| 2006/0279515 A1 | 12/2006 | Higashi |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0109243 A1 | 5/2007 | Higashi |
| 2007/0152217 A1 | 7/2007 | Lai et al. |
| 2007/0172591 A1 | 7/2007 | Seo et al. |
| 2007/0187678 A1 | 8/2007 | Hirao. et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0143653 A1 | 6/2008 | Shishido |
| 2008/0166834 A1 | 7/2008 | Kim et al. |
| 2008/0182358 A1 | 7/2008 | Cowdery-Corvan et al. |
| 2008/0197344 A1 | 8/2008 | Yano et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0121998 A1 | 5/2009 | Ohkawa et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0267873 A1 | 10/2009 | Ishii et al. |
| 2009/0278122 A1 | 11/2009 | Hosono et al. |
| 2009/0280600 A1 | 11/2009 | Hosono et al. |
| 2009/0295839 A1 | 12/2009 | Furukawa et al. |
| 2009/0303155 A1 | 12/2009 | Takasaki |
| 2009/0303166 A1 | 12/2009 | Tsubata |
| 2009/0305461 A1 | 12/2009 | Akimoto et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0193784 A1 | 8/2010 | Morosawa et al. |
| 2011/0062435 A1 | 3/2011 | Yamazaki et al. |
| 2011/0068388 A1 | 3/2011 | Yamazaki et al. |
| 2011/0104851 A1 | 5/2011 | Akimoto et al. |
| 2011/0121290 A1 | 5/2011 | Akimoto et al. |
| 2011/0133180 A1 | 6/2011 | Yamazaki |
| 2011/0193846 A1 | 8/2011 | Kimura et al. |
| 2015/0131021 A1 | 5/2015 | Kimura et al. |
| 2015/0340513 A1 | 11/2015 | Akimoto et al. |
| 2016/0377897 A1 | 12/2016 | Kimura et al. |
| 2018/0017819 A1 | 1/2018 | Kimura et al. |

FOREIGN PATENT DOCUMENTS

| | | |
|---|---|---|
| EP | 1548699 A | 6/2005 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2017881 A | 1/2009 |
| EP | 2058697 A | 5/2009 |
| EP | 2141744 A | 1/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-134273 A | 5/1993 |
| JP | 05-251705 A | 9/1993 |
| JP | 05-307167 A | 11/1993 |
| JP | 08-264794 A | 10/1996 |
| JP | 10-214065 A | 8/1998 |
| JP | 11-505377 | 5/1999 |
| JP | 11-338593 A | 12/1999 |
| JP | 2000-044236 A | 2/2000 |
| JP | 2000-150900 A | 5/2000 |
| JP | 2001-265248 A | 9/2001 |
| JP | 2002-076356 A | 3/2002 |
| JP | 2002-116423 A | 4/2002 |
| JP | 2002-289859 A | 10/2002 |
| JP | 2003-050405 A | 2/2003 |
| JP | 2003-086000 A | 3/2003 |
| JP | 2003-086808 A | 3/2003 |
| JP | 2004-004536 A | 1/2004 |
| JP | 2004-103957 A | 4/2004 |
| JP | 2004-273614 A | 9/2004 |
| JP | 2004-273732 A | 9/2004 |
| JP | 2005-099740 A | 4/2005 |
| JP | 2005-208611 A | 8/2005 |
| JP | 2006-165532 A | 6/2006 |
| JP | 2007-073614 A | 3/2007 |
| JP | 2007-123861 A | 5/2007 |
| JP | 2007-142195 A | 6/2007 |
| JP | 2007-233353 A | 9/2007 |
| JP | 2008-281988 A | 11/2008 |
| JP | 2008-283046 A | 11/2008 |
| JP | 2009-021536 A | 1/2009 |
| JP | 2009-085925 A | 4/2009 |
| JP | 2009-093023 A | 4/2009 |
| JP | 2009-141002 A | 6/2009 |
| JP | 2009-260378 A | 11/2009 |
| JP | 2009-276387 A | 11/2009 |
| JP | 2009-295997 A | 12/2009 |
| JP | 2010-016347 A | 1/2010 |
| JP | 2011-186450 A | 9/2011 |
| WO | WO-2004/114391 | 12/2004 |
| WO | WO-2008/026344 | 3/2008 |
| WO | WO-2008/126879 | 10/2008 |
| WO | WO-2008/143021 | 11/2008 |
| WO | WO-2009/072532 | 6/2009 |
| WO | WO-2009/081796 | 7/2009 |

(56) References Cited

FOREIGN PATENT DOCUMENTS

| WO | WO-2009/139483 | 11/2009 |
|---|---|---|
| WO | WO-2009/142289 | 11/2009 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kimizuka.N et al., "Spinel, YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu, or Zn] at Temperatures Over 1000°C", Journal of Solid State Chemistry, 1985, vol. 60, pp. 382-384.
Nakamura.M et al., "The phase relations in the In2O3-Ga2ZnO4-ZnO system at 1350°C", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions On Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda. T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED ", IDW '06 : Proceedings of the 13th International Display Workshops, Dec. 7, 2006, pp. 663-666.
Hosono.H, "68.3:INVITED Paper: Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO Tfts) for AMLCDs", J. Soc. Inf. Display (Journal of the Society for Information Display), 2007, vol. 15, No. 1, pp. 17-22.
Park.S et al., "Challenge To Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "Suftla Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper: World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors By DC Sputtering", SID Digest '09 : SID International Symposium Digest of Technical Papers, May 31, 2009, pp. 191-193.
Cho.D et al., "21.2:AL and Sn-Doped Zinc Indium Oxide Thin Film Transistors for Amoled Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.

(56) References Cited

OTHER PUBLICATIONS

Godo.H et al., "Temperature Dependence of Characteristics and Electronic Structure for Amorphous I—-Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198- 200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

* cited by examiner

DISPLAY DEVICE

BACKGROUND OF THE INVENTION

1. Field of the Invention

The present invention relates to a semiconductor device, a display device, a liquid crystal display device, and a light-emitting device and a method for manufacturing these devices. In particular, the present invention relates to a semiconductor device, a display device, a liquid crystal display device, and a light-emitting device each of which includes a circuit having a transistor including an oxide semiconductor film, and a method for manufacturing these devices.

2. Description of the Related Art

Thin film transistors (TFTs) in which silicon layers formed using amorphous silicon or the like are used for channel layers have been widely used as switching elements in display devices typified by liquid crystal display devices. Although thin film transistors formed using amorphous silicon have low field-effect mobility, they have an advantage that larger glass substrates can be used.

Moreover, attention has been recently drawn to a technique by which a transistor is manufactured using a metal oxide with semiconductor properties and such a transistor is applied to an electronic device or an optical device. For example, it is known that some metal oxides such as tungsten oxide, tin oxide, indium oxide, and zinc oxide have semiconductor properties. Patent Document 1 discloses a transistor in which a transparent semiconductor layer formed using such a metal oxide is used as a channel formation region.

REFERENCE

Patent Document 1: Japanese Published Patent Application No. 2006-165532

SUMMARY OF THE INVENTION

An object of one embodiment of the present invention is to provide a semiconductor device or the like with less noise, to provide a semiconductor device or the like with high withstand voltage, to provide a semiconductor device or the like with low power consumption, or to provide a display device or the like that can perform accurate display. Note that the description of these objects does not exclude another object. In addition, one embodiment of the present invention does not necessarily achieve all the objects listed above.

In order to achieve any of the above objects, a circuit is formed using a transistor including an oxide semiconductor (OS), particularly a MOS transistor including an oxide semiconductor. The oxide semiconductor is a substantially intrinsic semiconductor. For that reason, the off-state current is extremely low.

According to one embodiment of the present invention, a liquid crystal display device includes a pixel portion including a plurality of pixels, and a precharge circuit. The precharge circuit includes a plurality of first transistors. Each of the plurality of pixels includes a second transistor and a liquid crystal element. Each of the first transistors and the second transistors includes an oxide semiconductor.

According to one embodiment of the present invention, a liquid crystal display device includes a pixel portion including a plurality of pixels, and an inspection circuit. The inspection circuit includes a plurality of first transistors. Each of the plurality of pixels includes a second transistor and a liquid crystal element. Each of the first transistors and the second transistors includes an oxide semiconductor.

According to one embodiment of the present invention, a liquid crystal display device includes a pixel portion including a plurality of pixels, and a circuit. The circuit includes a plurality of first transistors. Each of the plurality of pixels includes a second transistor and a liquid crystal element. Gates of the plurality of first transistors are electrically connected to each other. First terminals of the plurality of first transistors are electrically connected to each other. All of second terminals of the plurality of first transistors are electrically connected to the pixel portion. The gates of the plurality of first transistors are in a floating state. Each of the first transistors and the second transistors includes an oxide semiconductor.

According to one embodiment of the present invention, a liquid crystal display device includes a pixel portion including a plurality of pixels, and a circuit. The circuit includes a plurality of first transistors. Each of the plurality of pixels includes a second transistor and a liquid crystal element. Gates of the plurality of first transistors are electrically connected to each other. First terminals of the plurality of first transistors are electrically connected to each other. All of second terminals of the plurality of first transistors are electrically connected to the pixel portion. The first terminals of the plurality of first transistors are in a floating state. Each of the first transistors and the second transistors includes an oxide semiconductor.

In any of the above liquid crystal display devices, the oxide semiconductor included in the first transistors and the second transistors may be an intrinsic semiconductor.

In the invention disclosed herein, a circuit is formed using a transistor that includes an oxide semiconductor and has a low off-state current; thus, unnecessary current can be prevented from being leaked into the circuit. For that reason, the circuit is more likely to operate normally. As a result, accurate display can be performed in a display device that includes a circuit having a transistor including an oxide semiconductor.

DETAILED DESCRIPTION OF THE INVENTION

Figure 1:
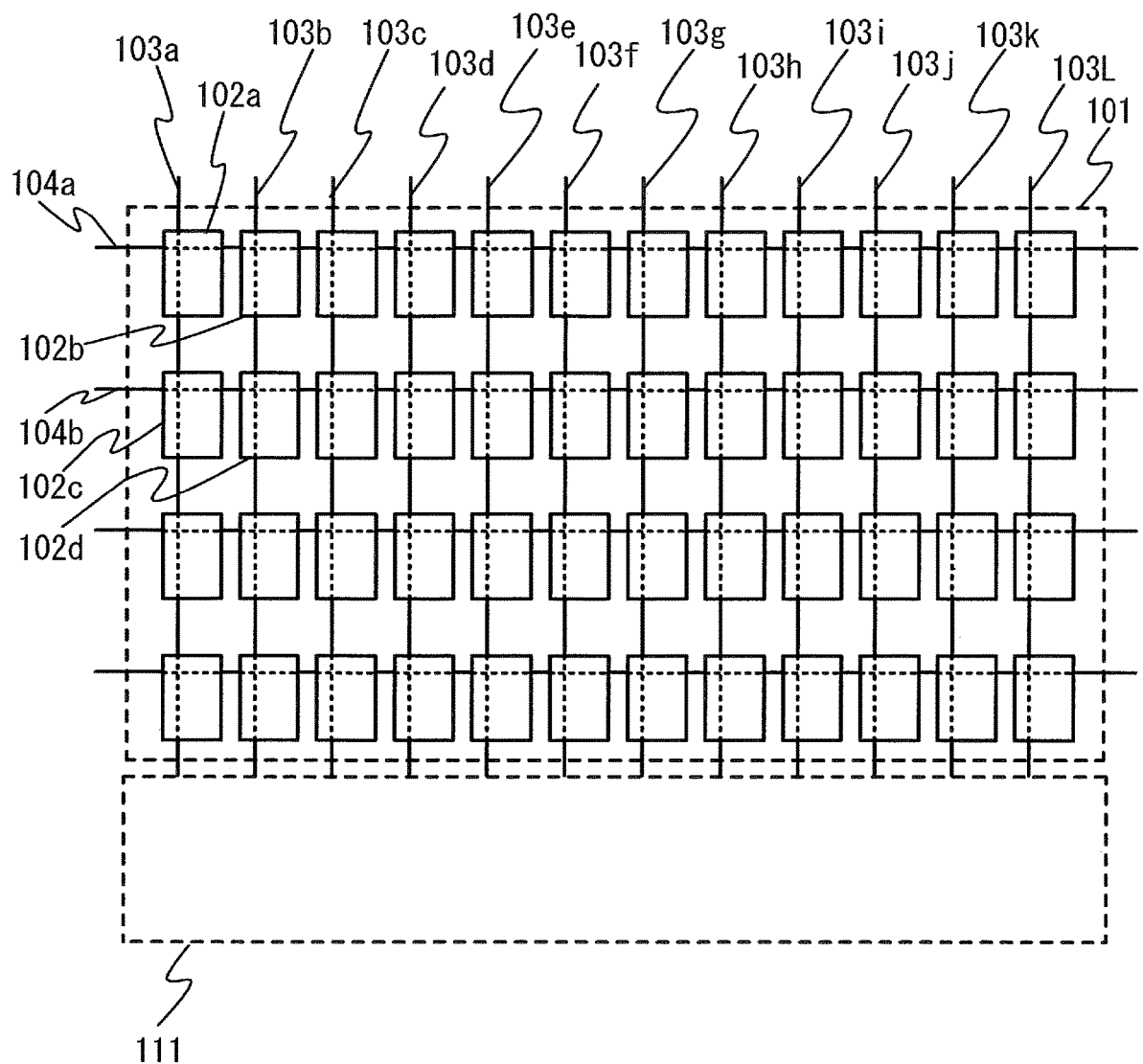
FIG. 1 is a circuit diagram illustrating a semiconductor device.

Embodiments will be described below with reference to the accompanying drawings. Note that in structures described below, the same portions or portions having similar functions are denoted by the same reference numerals, and description thereof is not repeated.

Embodiment 1

In this embodiment, an example of a device (a semiconductor device, a display device, or a light-emitting device) having a transistor including an oxide semiconductor, particularly a transistor including an oxide semiconductor in an active layer will be described with reference to drawings. The off-state current of a transistor including an oxide semiconductor is low; therefore, defects caused due to off-state current can be reduced in a semiconductor device or the like including an oxide semiconductor. Moreover, a transistor including an oxide semiconductor has high withstand voltage. For that reason, even when high voltage is applied to the transistor, the transistor can operate normally and the off-state current can be low; thus, defects caused due to off-state current can be reduced.

FIG. 1 illustrates an example of a structure of a device in this embodiment.

The device according to one example of this embodiment includes a pixel portion 101 and a circuit 111.

A plurality of pixels are arranged in matrix in the pixel portion 101. Here, the expression "pixels are arranged (provided) in matrix" also includes the case where the pixels are arranged in a straight line and the case where the pixels are arranged in a jagged line, in the longitudinal direction or the lateral direction. For example, a pixel 102a and a pixel 102b are aligned in the lateral direction. Similarly, a pixel 102c and a pixel 102d are aligned in the lateral direction. Moreover, the pixel 102a and the pixel 102c are aligned in the longitudinal direction. Similarly, the pixel 102b and the pixel 102d are aligned in the longitudinal direction. The pixels are connected to each other with wirings. Pixels arranged in the longitudinal direction are connected with a wiring extended in the vertical direction. Pixels arranged in the lateral direction are connected with a wiring extended in the horizontal direction. For example, the pixel 102a and the pixel 102b are connected with a wiring 104a. Similarly, the pixel 102c and the pixel 102d are connected with a wiring 104b. Furthermore, the pixel 102a and the pixel 102c are connected with a wiring 103a. Similarly, the pixel 102b and the pixel 102d are connected with a wiring 103b. Note that pixels can be connected with another wiring, for example, a wiring to which all the pixels are connected (e.g., a common wiring or a power supply line). Further, pixels other than the pixels 102a to 102d are arranged and connected in a similar manner.

Here, the wirings provided in the horizontal direction, such as the wirings 104a and 104b, are sometimes connected to gates of transistors included in pixels and thus can have a function of a gate signal line (a gate wiring, a gate line, or the like). Alternatively, the wirings provided in the horizontal direction, such as the wirings 104a and 104b, are supplied with a selection signal per row and the signal is scanned in some cases. Thus, the wirings provided in the horizontal direction, such as the wirings 104a and 104b, can have a function of a scan signal line (a scan wiring, a scan line, or the like).

The wirings provided in the vertical direction, such as the wiring 103a, the wiring 103b, a wiring 103c, a wiring 103d, a wiring 103e, a wiring 103f, a wiring 103g, a wiring 103h, a wiring 103i, a wiring 103j, a wiring 103k, and a wiring 103L (the wirings 103a to 103L), are sometimes connected to sources or drains of transistors included in pixels and thus can have a function of a source signal line (a source wiring, a source line, or the like). Alternatively, the wirings provided in the vertical direction, such as the wirings 103a to 103L, are sometimes supplied with a data signal, a video signal, a source signal, or the like and thus can have a function of a data signal line (a data wiring, a data line, or the like).

The circuit 111 is connected to the pixel portion 101 or the pixels through the wirings provided in the vertical direction, such as the wirings 103a to 103L. The circuit 111 can have a variety of functions.

Figure 2:
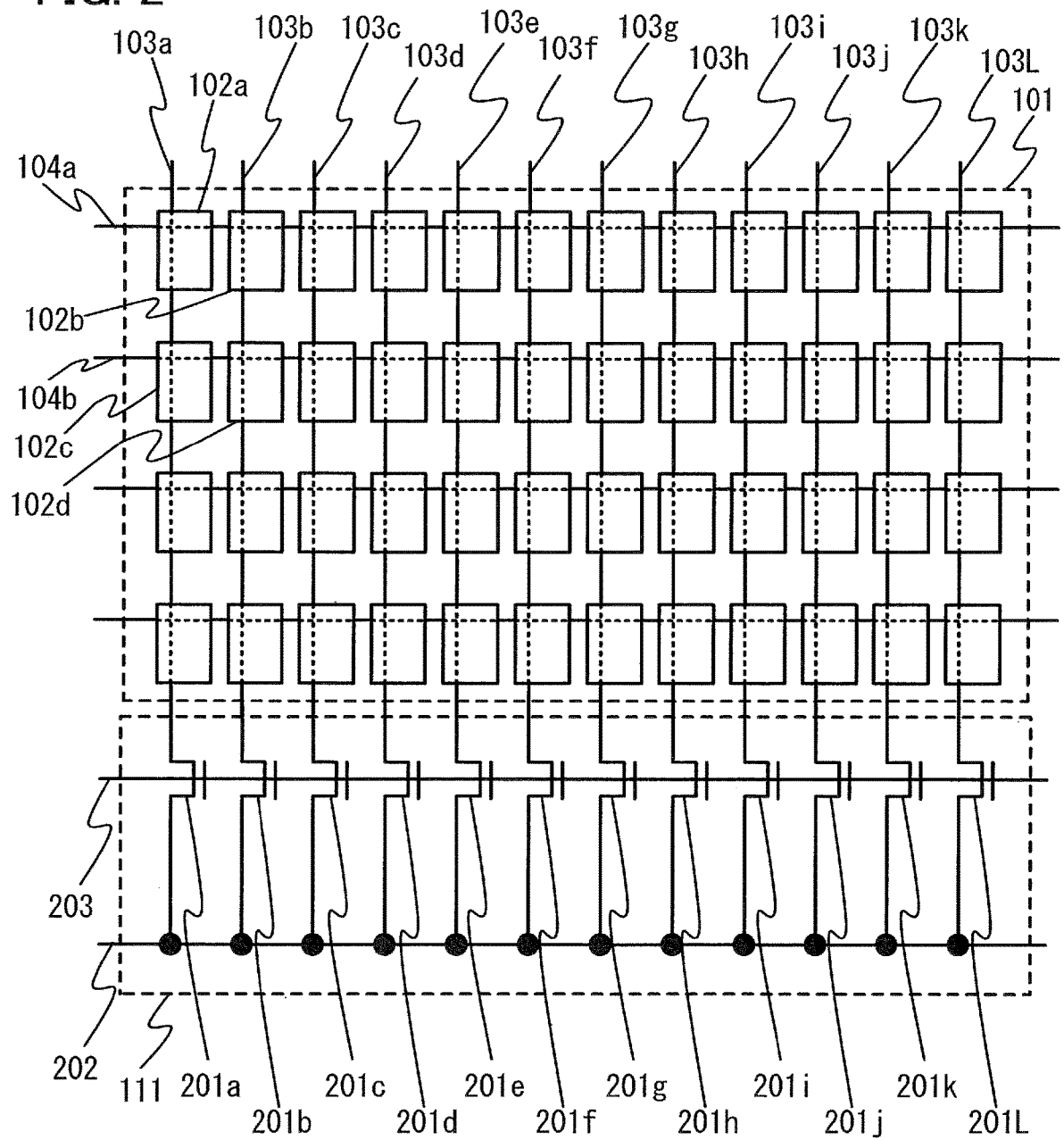
FIG. 2 is a circuit diagram illustrating a semiconductor device.

FIG. 2 illustrates an example of a circuit configuration showing the details of the circuit 111. For example, the circuit 111 can have a function of a precharge circuit or a function of an inspection circuit. Alternatively, the circuit 111 can have both a function of a precharge circuit and a function of an inspection circuit. Note that one embodiment of the present invention is not limited to these examples.

The circuit 111 includes a transistor 201a, a transistor 201b, a transistor 201c, a transistor 201d, a transistor 201e, a transistor 201f, a transistor 201g, a transistor 201h, a transistor 201i, a transistor 201j, a transistor 201k, and a transistor 201L (the transistors 201a to 201L). The wirings 103a to 103L are connected to a wiring 202 through the transistors 201a to 201L, respectively. Therefore, either sources or drains of the transistors 201a to 201L are connected to the wiring 202, and the rest of the sources and drains of the transistors 201a to 201L are connected to the respective wirings 103a to 103L. A wiring 203 is connected to gates of the transistors 201a to 201L. That is, the gates of the transistors 201a to 201L are connected to each other.

Note that in this specification and the like, a transistor is an element having at least three terminals of a gate, a drain, and a source. The transistor has a channel region between the drain (a drain terminal, a drain region, or a drain electrode) and the source (a source terminal, a source region, or a source electrode), and current can flow through the drain, the channel region, and the source.

Note that in this specification and the like, a transistor with a multi-gate structure having two or more gate electrodes can be used, for example. With the multi-gate structure, a structure where a plurality of transistors are connected in series is provided because channel regions are connected in series. Thus, with the multi-gate structure, the amount of off-state current can be reduced and the withstand voltage of the transistor can be increased (the reliability can be improved). Alternatively, with the multi-gate structure, drain-source current does not change much even if drain-source voltage changes when the transistor operates in a saturation region, so that a flat slope of voltage-current characteristics can be obtained. By utilizing the flat slope of the voltage-current characteristics, an ideal current source circuit or an active load having an extremely large resistance can be realized. Accordingly, a differential circuit, a current mirror circuit, or the like having excellent properties can be realized.

Note that a transistor with a structure where gate electrodes are formed above and below a channel can be used, for example. With the structure where the gate electrodes are formed above and below the channel, a circuit structure where a plurality of transistors are connected in parallel is provided. Thus, a channel region is increased, so that the amount of current can be increased. Alternatively, with the structure where the gate electrodes are formed above and below the channel, a depletion layer is easily formed; thus, the subthreshold swing value (S value) can be improved.

Figure 3:
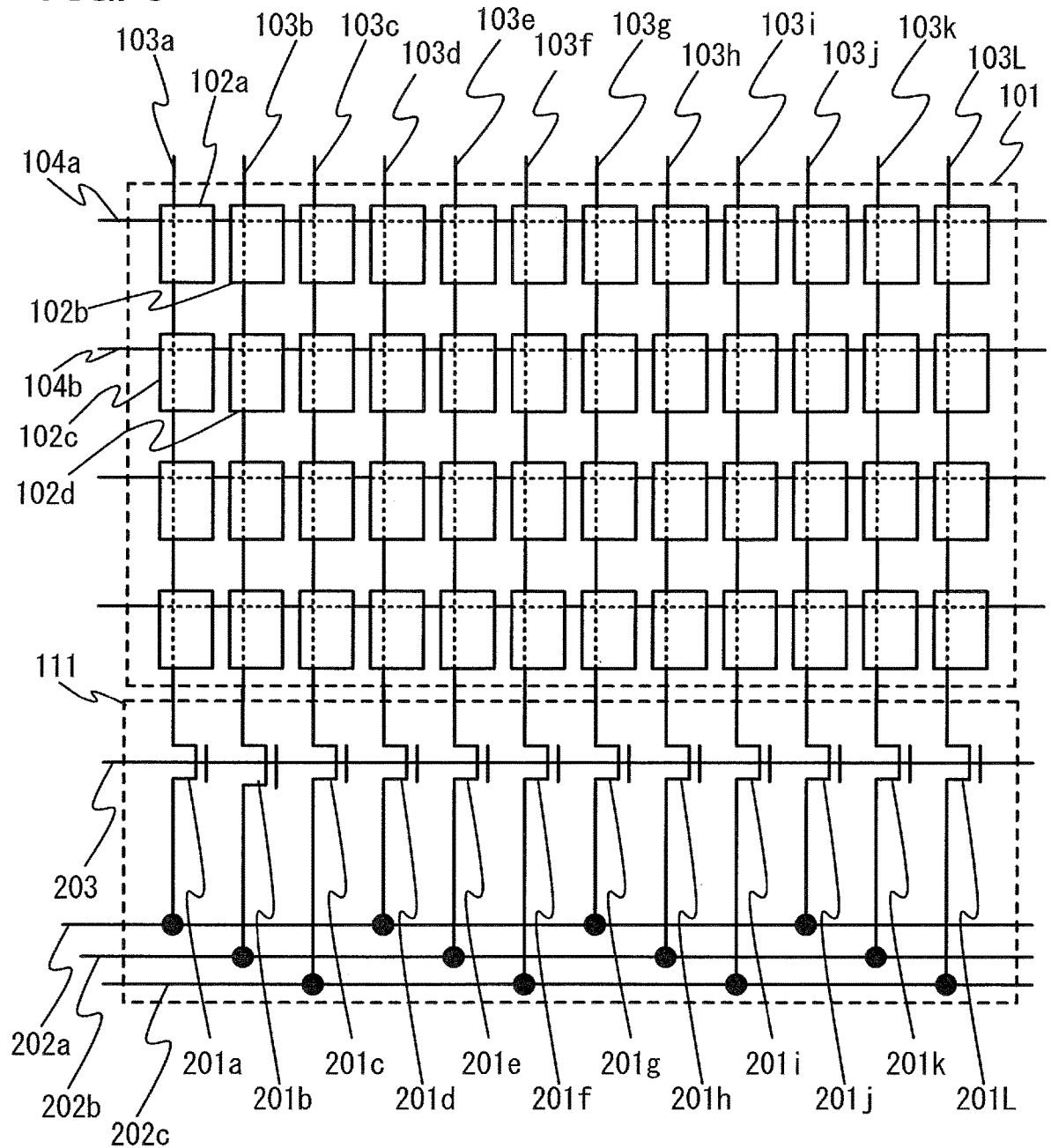
FIG. 3 is a circuit diagram illustrating a semiconductor device.

The circuit 111 is not limited to having the configuration in FIG. 2 and can have a variety of configuration. FIG. 3 illustrates another example of the circuit 111. The description of FIG. 1 and FIG. 2 can be applied to FIG. 3.

FIG. 3 illustrates an example of the case where a plurality of wirings 202 are provided in FIG. 2. FIG. 3 shows the case where three wirings 202 are provided; however, one embodiment of the present invention is not limited to this example, and two wirings 202 or four or more wirings 202 can be provided. The wirings 103a to 103L are connected to one of a wiring 202a, a wiring 202b, and a wiring 202c through the respective transistors 201a to 201L. Therefore, either sources or drains of the transistors 201a to 201L are connected to one of the wirings 202a, 202b, and 202c, and the rest of the sources and drains of the transistors 201a to 201L are connected to the respective wirings 103a to 103L. The wiring 203 is connected to gates of the transistors 201a to 201L. That is, the gates of the transistors 201a to 201L are connected to each other.

In the case of performing color display, each color of pixels performing display can correspond to one of the wirings 202a, 202b, and 202c. For example, a wiring that is connected to the wiring 202a through a transistor is connected to red pixels. Therefore, the wiring 202a is connected to the wirings 103a, 103d, 103g, and 103j through the respective transistors. Similarly, a wiring that is connected to the wiring 202b through a transistor is connected to blue pixels. Therefore, the wiring 202b is connected to the wirings 103b, 103e, 103h, and 103k through the respective transistors. Similarly, a wiring that is connected to the wiring 202c through a transistor is connected to green pixels. Therefore, the wiring 202c is connected to the wirings 103c, 103f, 103i, and 103L through the respective transistors. Note that the colors are not limited to red, blue, and green; for example, four colors (RGB and white) can be used or a plurality of slightly different reds (or blues or greens) can be used. Accordingly, colors can be controlled.

Figure 4:
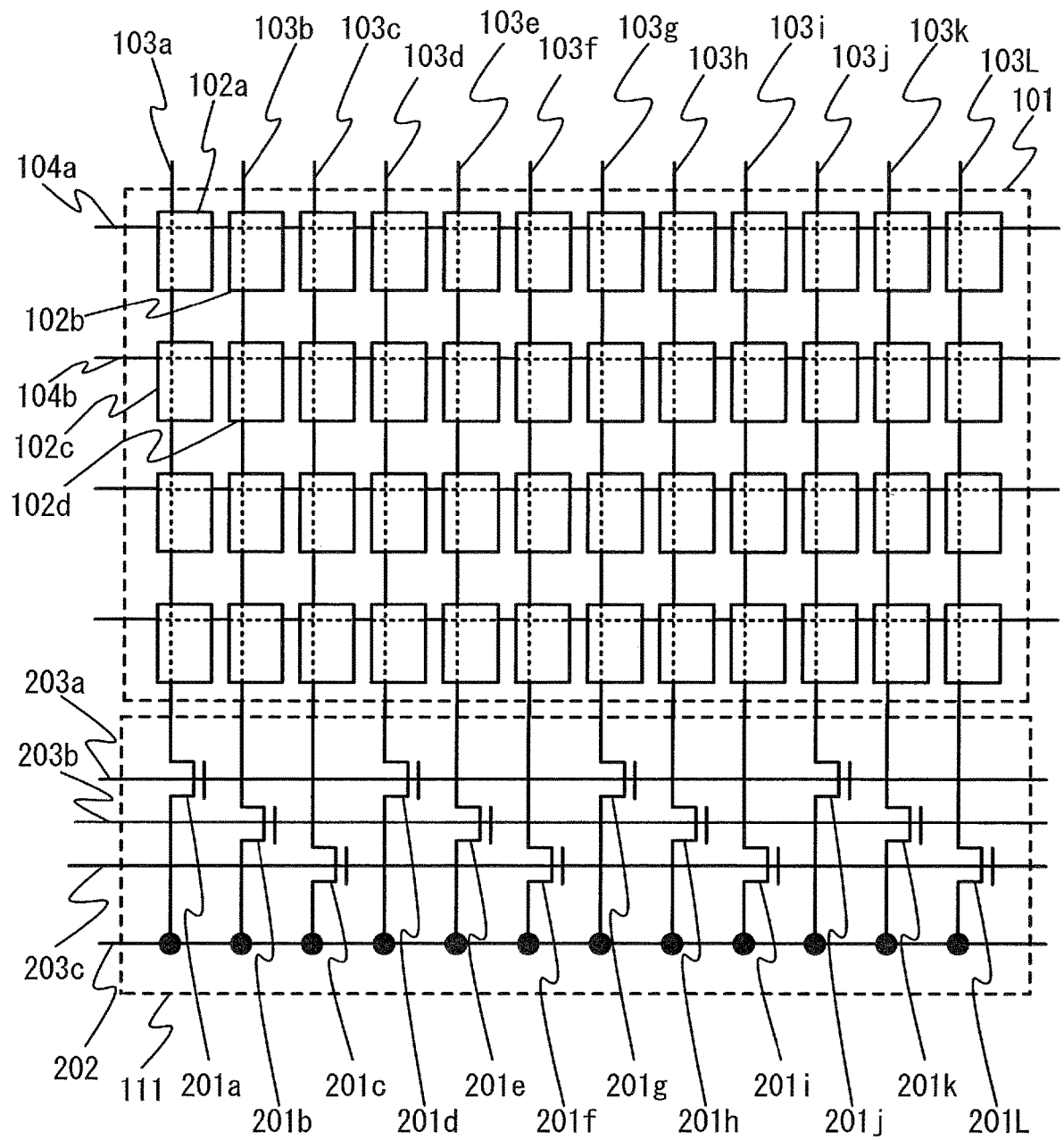
FIG. 4 is a circuit diagram illustrating a semiconductor device.

Next, FIG. 4 illustrates another example of the configuration of the circuit 111. The description of FIG. 1, FIG. 2, and FIG. 3 can be applied to FIG. 4.

FIG. 4 illustrates an example of the case where a plurality of wirings 203 are provided in FIG. 2. FIG. 4 shows the case where three wirings 203 are provided; however, one embodiment of the present invention is not limited to this example, and two wirings 203 or four or more wirings 203 can be provided. The wirings 103a to 103L are connected to the wiring 202 through the transistors 201a to 201L, respectively. Therefore, either sources or drains of the transistors 201a to 201L are connected to the wiring 202, and the rest of the sources and drains of the transistors 201a to 201L are connected to the respective wirings 103a to 103L. Gates of the transistors 201a to 201L are connected to one of a wiring 203a, a wiring 203b, and a wiring 203c. That is, the gates of some of the transistors 201a to 201L (e.g., the transistors 201a, 201d, 201g, and 201j) are connected to each other and to the wiring 203a. Similarly, the gates of some of the transistors 201a to 201L (e.g., the transistors 201b, 201e, 201h, and 201k) are connected to each other and to the wiring 203b. Similarly, the gates of the others (e.g., the transistors 201c, 201f, 201i, and 201L) are connected to each other and to the wiring 203c.

In the case of performing color display, each color of pixels performing display can correspond to one of the wirings 203a, 203b, and 203c. For example, a wiring that is connected to the wiring 202 through a transistor whose gate is connected to the wiring 203a is connected to red pixels. Therefore, the wiring 202 is connected to the wirings 103a, 103d, 103g, and 103j through the respective transistors each having the gate connected to the wiring 203a. Similarly, a wiring that is connected to the wiring 202 through a transistor whose gate is connected to the wiring 203b is connected to blue pixels. Therefore, the wiring 202 is connected to the wirings 103b, 103e, 103h, and 103k through the respective transistors each having the gate connected to the wiring 203b. Similarly, a wiring that is connected to the wiring 202 through a transistor whose gate is connected to the wiring 203c is connected to green pixels. Therefore, the wiring 202 is connected to the wirings 103c, 103f, 103i, and 103L through the respective transistors each having the gate connected to the wiring 203c. Note that the colors are not limited to red, blue, and green; for example, four colors (RGB and white) can be used or a plurality of slightly different reds (or blues or greens) can be used. Accordingly, colors can be controlled.

Figure 5:
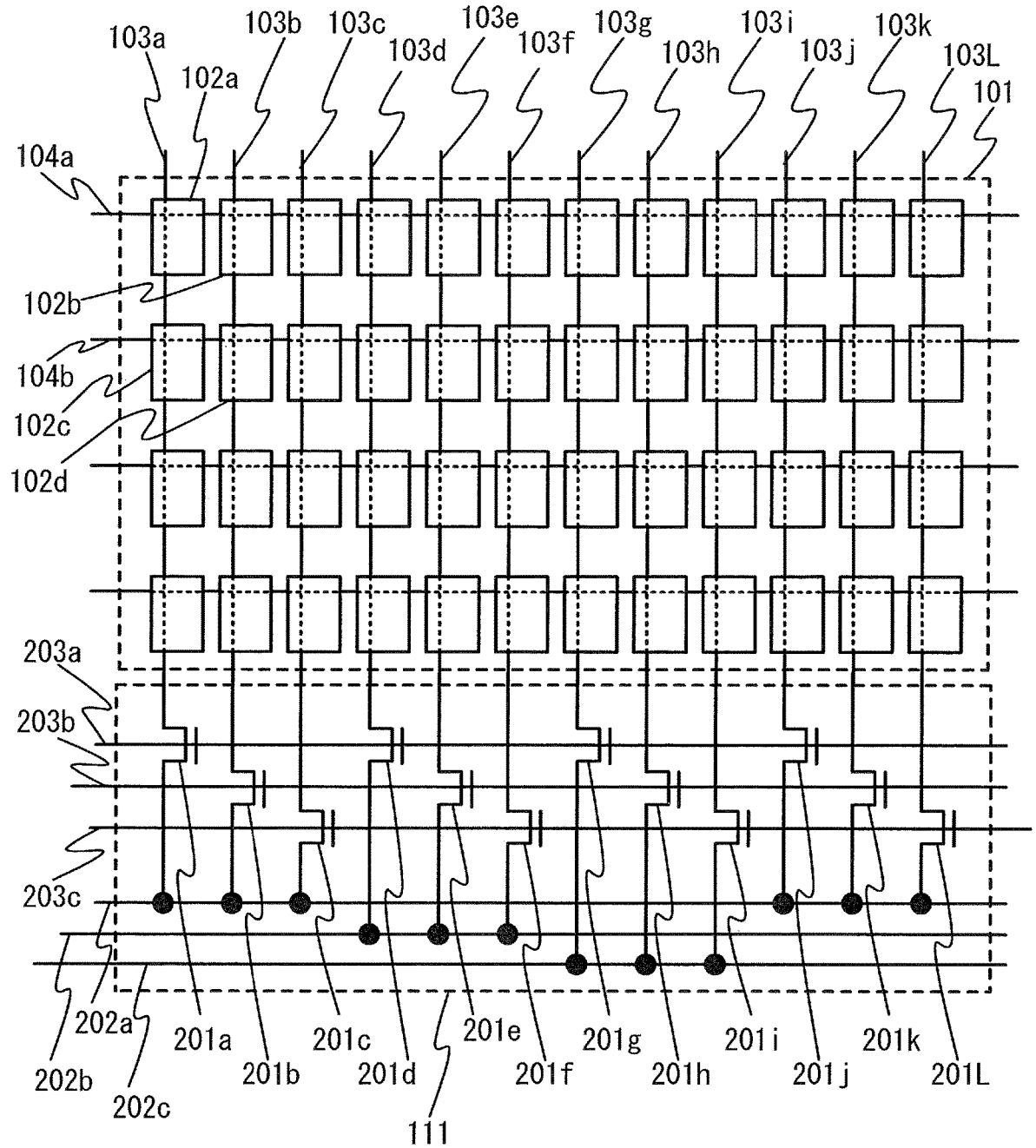
FIG. 5 is a circuit diagram illustrating a semiconductor device.

Next, FIG. 5 illustrates another example of the configuration of the circuit 111.

The description of FIG. 1, FIG. 2, FIG. 3, and FIG. 4 can be applied to FIG. 5.

FIG. 5 illustrates an example of the case where a plurality of wirings 202 and a plurality of wirings 203 are provided in FIG. 2. That is, FIG. 5 corresponds to the case where a plurality of wirings 203 are provided in FIG. 3 and the case where a plurality of wirings 202 are provided in FIG. 4. FIG. 5 shows the case where three wirings 202 and three wirings 203 are provided; however, one embodiment of the present invention is not limited to this example, and the number of the wiring 202 and/or the wiring 203 can be two or four or more. The wirings 103a to 103L are connected to one of the wirings 202a, 202b, and 202c through the respective transistors 201a to 201L. Therefore, either sources or drains of the transistors 201a to 201L are connected to one of the wirings 202a, 202b, and 202c, and the rest of the sources and drains of the transistors 201a to 201L are connected to the respective wirings 103a to 103L. Gates of the transistors 201a to 201L are connected to one of the wirings 203a, 203b, and 203c. That is, the gates of some of the transistors 201a to 201L (e.g., the transistors 201a, 201d, 201g, and 201j) are connected to each other and to the wiring 203a. Similarly, the gates of some of the transistors 201a to 201L (e.g., the transistors 201b, 201e, 201h, and 201k) are connected to each other and to the wiring 203b. Similarly, the gates of the others (e.g., the transistors 201c, 201f, 201i, and 201L) are connected to each other and to the wiring 203c.

In the case of performing color display, as in FIG. 2, FIG. 3, and FIG. 4, each color of pixels performing display can correspond to one of the wirings 203a, 203b, and 203c or one of the wirings 202a, 202b, and 202c. Accordingly, colors can be controlled.

Embodiment 2

In this embodiment, an example of the operation of the circuit 111 illustrated in FIG. 2, FIG. 3, FIG. 4, and FIG. 5 will be described.

The circuit 111 can have a variety of functions depending on an operation method. For example, the circuit 111 can have a function of an inspection circuit and/or a function of a precharge circuit. Note that one embodiment of the present invention is not limited to this example, and the circuit 111 can have another function.

Figure 6A:
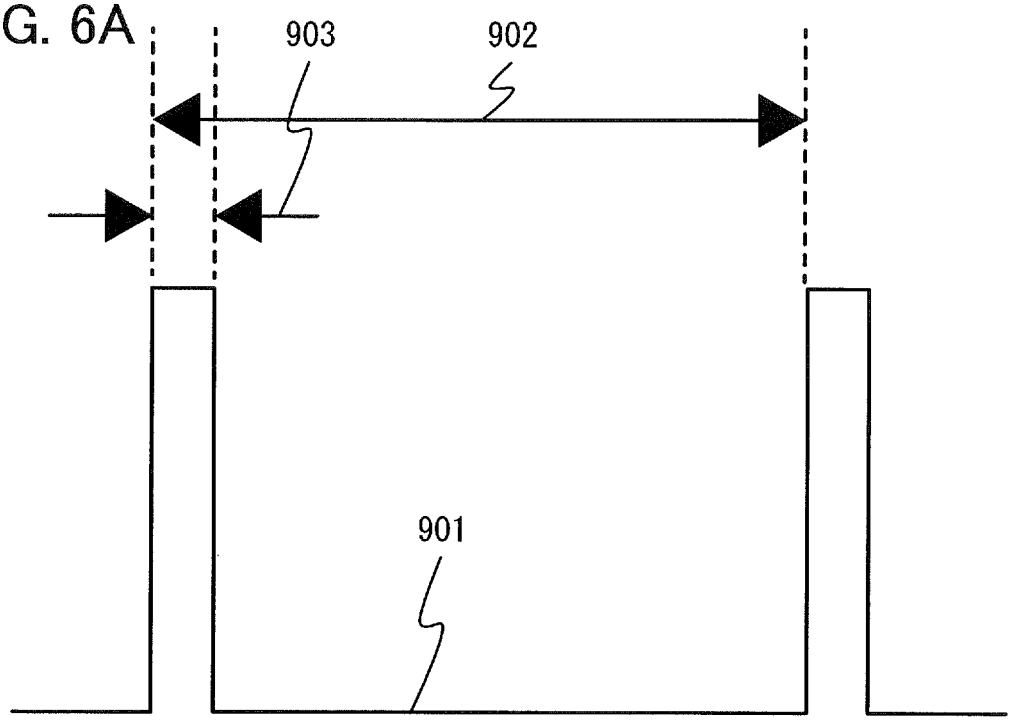
FIGS. 6A and 6B are timing charts each illustrating a waveform of a signal in a semiconductor device.
Figure 6B:
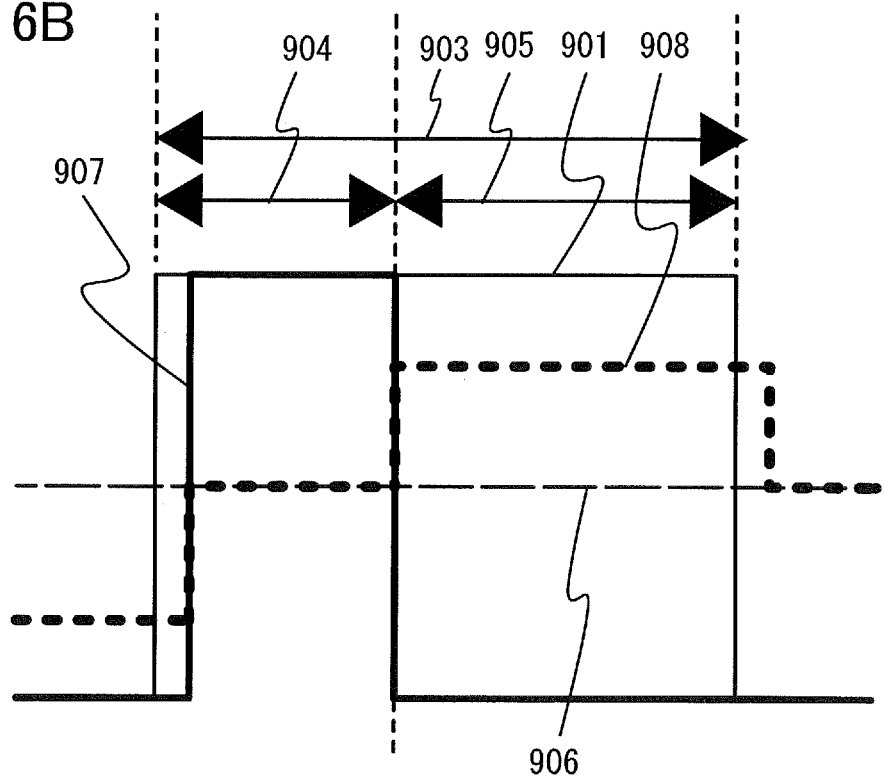

First, an operation method in the case where the circuit 111 is operated as a precharge circuit will be described. FIGS. 6A and 6B show waveforms in the case where precharge is performed. FIG. 6A shows a waveform of a signal supplied to a wiring in a given row, for example, the wiring 104a. A signal 901 has a waveform with a cycle 902. The cycle 902 often corresponds to one frame period or one subframe period, for example. In the cycle 902, the signal 901 is at H level only in a period 903 and is at L level in the other periods. The period 903 often corresponds to one gate selection period or 1H period, for example. FIG. 6B shows detailed waveforms in one gate selection period. One gate selection period can be considered to be divided into a former period 904 and a latter period 905. In the former period 904, a predetermined voltage can be supplied to the wirings 103a to 103L in advance. Such an operation for supplying a predetermined voltage in advance corresponds to precharge. That is, the former period 904 can be referred to as a precharge period. In the latter period 905, a video signal is supplied. That is, the latter period 905 can be referred to as a signal input period. As an example, a signal 908 represents a signal supplied to any one of the wirings 103a to 103L. The potential of the signal 908 becomes approximately equal to a potential 906 in the former period 904. Here, the potential 906 can be a reference potential, for example, a potential that is approximately equal to a common potential or a counter potential supplied to a display element (e.g., a liquid crystal element). Alternatively, the potential 906 preferably lies nearly in the middle of the amplitude of the potential of a video signal. In the latter period 905, the potential of the signal 908 becomes a potential corresponding to a video signal.

Accordingly, the potential of the signal 908 in the latter period 905 varies as appropriate depending on the polarity of a video signal or a signal supplied to a liquid crystal element, for example. By thus supplying a predetermined voltage to the wirings 103a to 103L in advance, a signal can be supplied rapidly. Thus, the speed of writing signals is increased, leading to a reduction in the time for writing signals.

In the circuit in FIG. 2, a signal like a signal 907 is supplied to the wiring 203. In the former period 904, the signal 907 is a voltage with which the transistors 201a to 201L are turned on. Moreover, the potential 906 is supplied to the wiring 202. Thus, the wirings 103a to 103L can be precharged in the former period 904.

In this case, when the potential of each wiring is controlled by a transistor including an oxide semiconductor, adverse effects of the off-state current of the transistor can be reduced; thus, leakage of voltage and noise can be reduced, and accurate voltages can be supplied to wirings. Therefore, the use of the transistor including an oxide semiconductor can realize accurate display.

As described above, the transistors 201a to 201L have a function of being turned on or off, controlled with a gate signal. Accordingly, the transistors 201a to 201L can have a switch function.

The circuit in FIG. 3 includes a plurality of wirings 202a to 202c. For that reason, in the former period 904, different potentials can be supplied to the wirings 103a to 103L. Therefore, for example, potentials different depending on colors can be supplied to the wirings 103a to 103L in the former period 904. Accordingly, the circuit can operate optimally to express various colors.

Figure 7:
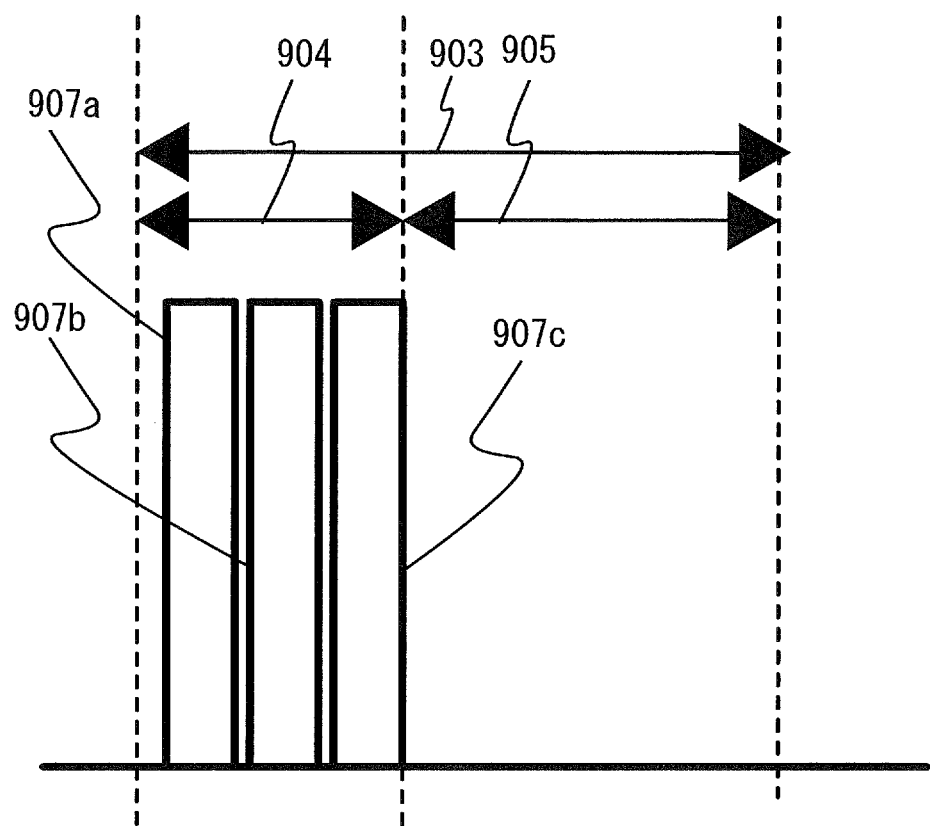
FIG. 7 is a timing chart illustrating waveforms of signals in a semiconductor device.

The circuit in FIG. 4 includes a plurality of wirings 203a to 203c. For that reason, when the former period 904 is further divided into a plurality of periods, only one of the transistors 201a to 201L can be turned on. FIG. 7 shows waveforms of signals supplied to the wirings 203a to 203c in that case. A signal 907a represents a signal supplied to the wiring 203a. A signal 907b represents a signal supplied to the wiring 203b. A signal 907c represents a signal supplied to the wiring 203c. The signal 907a is at H level only in the first third of the former period 904. The signal 907b is at H level only in the middle third of the former period 904. The signal 907c is at H level only in the final third of the former period 904. By thus dividing the former period 904 into a plurality of periods so that potentials supplied to the wiring 202 are made different in the plurality of periods, potentials supplied to the wirings 103a to 103L can be made to vary. Therefore, in the former period 904, potentials different depending on colors can be supplied to the wirings 103a to 103L. Accordingly, the circuit can operate optimally in accordance with colors.

The circuit in FIG. 5 includes a plurality of wirings 202a to 202c. For that reason, in the former period 904, different potentials can be supplied to the wirings 103a to 103L. Furthermore, the circuit in FIG. 5 includes a plurality of wirings 203a to 203c. For that reason, when the former period 904 is divided into a plurality of periods as illustrated in FIG. 7, only one of the transistors 201a to 201L can be turned on. By thus dividing the former period 904 into a plurality of periods so that potentials supplied to the wirings 202a to 202c are made different in the plurality of periods, potentials supplied to the wirings 103a to 103L can be made to vary. Therefore, in the former period 904, potentials different depending on colors can be supplied to the wirings 103a to 103L. Accordingly, the circuit can operate optimally in accordance with colors.

Next, an operation method in the case where the circuit 111 is operated as an inspection circuit will be described. First, the case of the circuit 111 in FIG. 2 is described.

First, a signal is supplied to a pixel by a given means. For example, a signal is supplied to the wirings 103a to 103L from a signal line driver circuit connected to the wirings 103a to 103L. Preferably, a signal is supplied to one of the wirings 103a to 103L. Alternatively, the transistors 201a to 201L are turned on to supply a signal to the wirings 103a to 103L, preferably one of the wirings 103a to 103L, through the wiring 202. Further alternatively, a probe for supplying a signal comes into contact with the wirings 103a to 103L, preferably one of the wirings 103a to 103L, to supply a signal. Then, an H-level signal is supplied to any one of gate lines such as the wirings 104a and 104b. Thus, the signal is supplied into a pixel when a transistor in the pixel operates normally. After that, an L-level signal is supplied to that gate line. As a result, the signal is held in the pixel.

Next, an H-level signal is supplied to the gate line, so that the signal held in the pixel is supplied to the wirings 103a to 103L. At this time, an H-level signal is supplied to the wiring 203 to turn on the transistors 201a to 201L. Thus, the signal held in the pixel can be read through the wiring 202.

In this case, if the transistor in the pixel is defective, the signal cannot be properly read. Therefore, whether the transistor normally operates or not can be inspected depending on whether the signal is properly read.

In the case where a signal is supplied to one of the wirings 103a to 103L, a signal is then supplied to another one of the wirings 103a to 103L and a similar operation is repeated. Further, this operation is performed on all the gate lines. Thus, all the pixels can be inspected. In the case where one gate line is being selected, when a signal is supplied to only one of a plurality of pixels connected to the gate line and reading is performed on the pixel, inspection can be accurately performed on a pixel-by-pixel basis. On the other hand, when a signal is supplied to some or all of a plurality of pixels and reading is performed on the pixels, the pixels can be roughly inspected.

In FIG. 3, a plurality of wirings 202a to 202c are provided. For that reason, signals held in a plurality of pixels can be read at the same time through the wirings 202a to 202c. Three wirings are provided in the case of FIG. 3; therefore, signals can be supplied to three pixels at the same time, and the signals in three pixels can be read at the same time. Thus, rapid inspection can be realized. As a result, the duration of a manufacturing process of a semiconductor device or the like can be reduced, and costs can be reduced.

In FIG. 4, a plurality of wirings 203a to 203c are provided. For that reason, signals held in pixels can be sequentially read through the wiring 202 in such a manner that signals supplied to the wirings 203a to 203c are sequentially set at H level. Accordingly, signals can be supplied to a plurality of pixels at the same time and sequentially read on a pixel-by-pixel basis. Thus, rapid inspection can be realized. As a result, the duration of a manufacturing process of a semiconductor device or the like can be reduced, and costs can be reduced.

In FIG. 5, a plurality of wirings 202a to 202c are provided. For that reason, signals held in a plurality of pixels can be read at the same time through the wirings 202a to 202c. Moreover, a plurality of wirings 203a to 203c are provided. For that reason, signals held in pixels can be sequentially read through the wiring 202 in such a manner that signals supplied to the wirings 203a to 203c are sequentially set at H level. Thus, rapid inspection can be realized. As a result, the duration of a manufacturing process of a semiconductor device or the like can be reduced, and costs can be reduced.

Such inspection is performed as part of a process for manufacturing a semiconductor device or the like. Therefore, an inspection circuit is not operated after the semiconductor device or the like is assembled and shipped.

If the off-state current of the transistors 201a to 201L is large, current is leaked, so that noise enters the wirings 103a to 103L. In view of the above, by using a transistor including an oxide semiconductor as the transistors 201a to 201L, the off-state current can be reduced and noise can be reduced.

As described above, by changing an operation method, the circuit 111 can realize a variety of functions. Accordingly, the circuit 111 can have both a function of a precharge circuit and a function of an inspection circuit. When the circuit 111 has both of the functions, a larger number of functions can be realized with a smaller number of circuits, resulting in lower cost, lower power consumption, and the like.

Embodiment 3

In this embodiment, examples of peripheral circuits of the circuit 111 will be described.

Figure 8A:
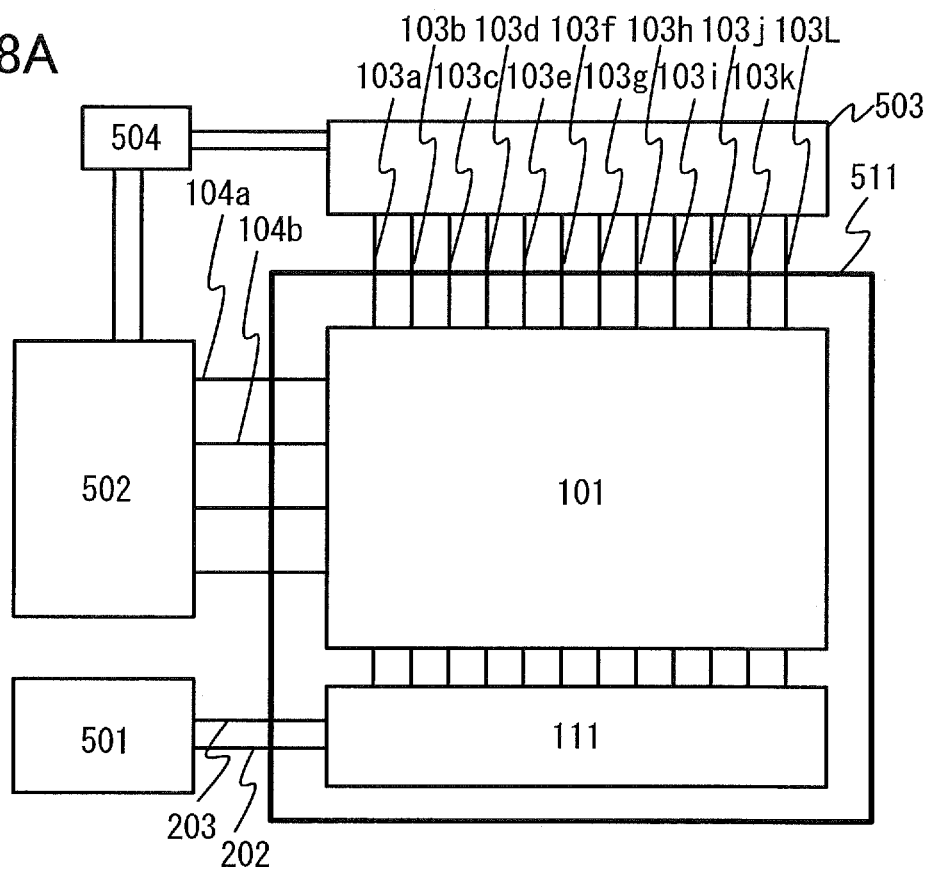
FIGS. 8A and 8B are circuit diagrams each illustrating a semiconductor device.
Figure 8B:
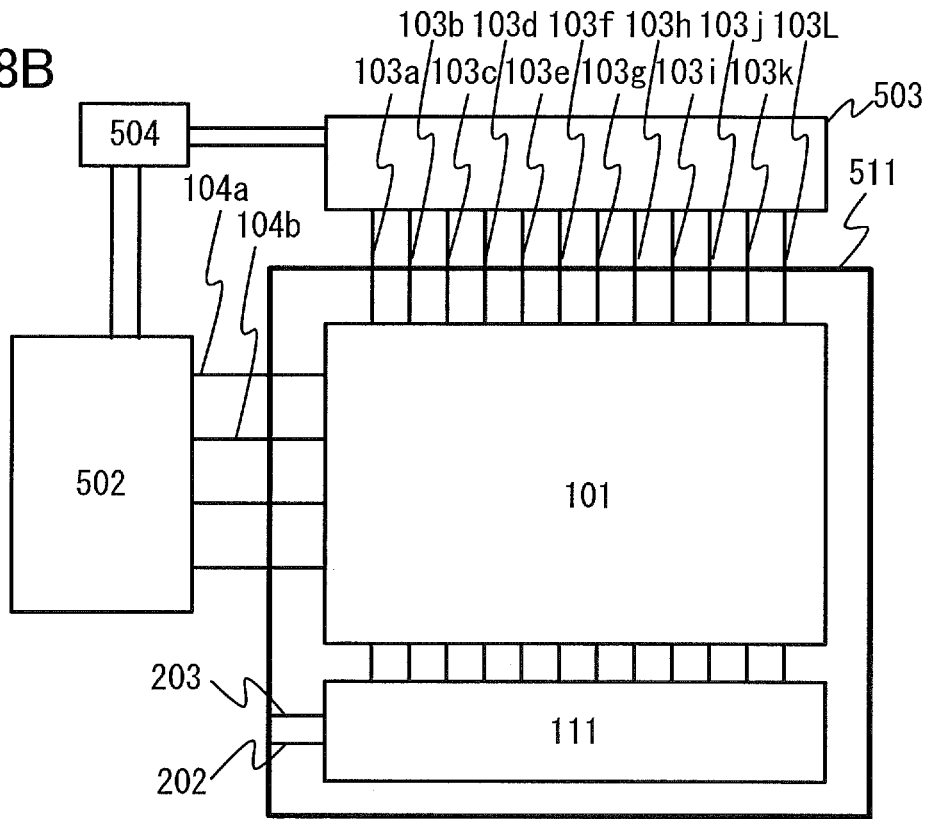

FIGS. 8A and 8B each illustrate the circuit 111, the pixel portion 101, and an example of peripheral circuits. The circuit 111 and the pixel portion 101 are placed over a substrate 511. In other words, a transistor and a wiring included in the circuit 111 are formed, etched, and patterned at the same time as a transistor and a wiring included in the pixel portion 101. That is, the circuit 111 and the pixel portion 101 are formed at the same time over one substrate through the same process. Thus, materials of the transistor and the wiring in the circuit 111 are the same as those of the transistor and the wiring in the pixel portion 101. For that reason, when the transistor in the pixel portion 101 includes an oxide semiconductor, the transistor in the circuit 111 also includes the oxide semiconductor.

Note that in this specification and the like, a transistor can be formed using a variety of substrates. There is no particular limitation on the kind of a substrate. Examples of the substrate are a semiconductor substrate (e.g., a single crystal substrate and a silicon substrate), an SOI substrate, a glass substrate, a quartz substrate, and a flexible substrate. For a flexible substrate, a flexible synthetic resin such as plastics typified by polyethylene terephthalate (PET) and polyethylene naphthalate (PEN), or acrylic can be used, for example.

Note that a transistor may be formed using one substrate, and then the transistor may be transferred to another substrate.

Note that all the circuits that are necessary to realize a desired function can be formed using one substrate. Thus, costs can be reduced by reduction in the number of components, or the reliability can be improved by reduction in the number of connections to circuit components.

In FIG. 8A, a circuit 501, a circuit 502, a circuit 503, and a circuit 504 are formed over substrates different from the substrate 511. For example, the circuit 501, the circuit 502, the circuit 503, or the circuit 504 includes an IC chip formed using a single crystal substrate or an SOI substrate. Note that the circuit 501, the circuit 502, the circuit 503, and/or the circuit 504 may be provided over the substrate 511 by COG (chip on glass).

Here, the circuit 501 has a function of controlling the circuit 111, supplying a signal and a voltage to the circuit 111, or reading a signal from the circuit 111, for example. The 501 has a function corresponding to the function of the circuit 111. For example, when the circuit 111 has a function of a precharge circuit, the circuit 501 has a function of controlling a precharge operation. Similarly, when the circuit 111 has a function of an inspection circuit, the circuit 501 has a function of controlling an inspection operation. Similarly, when the circuit 111 has a function of a precharge circuit and a function of an inspection circuit, the circuit 501 has a function of controlling a precharge operation and a function of controlling an inspection operation.

The circuit 502 has a function of supplying a signal to the wirings 104a and 104b and the like; therefore, the circuit 502 can have a function of a gate line driver circuit (a scan driver). The circuit 503 has a function of supplying a signal to the wirings 103a to 103L; therefore, the circuit 503 can have a function of a signal line driver circuit (a data driver).

The circuit 504 has a function of controlling the circuit 502 or the circuit 503. Therefore, the circuit 504 can have a function of a controller, a pulse generator circuit, a clock signal generator circuit, a common voltage generator circuit, a timing generator circuit, an image processing circuit, a power supply circuit, or the like.

FIG. 8B illustrates the case where the circuit 501 is not provided in the structure of FIG. 8A. In the case where the circuit 111 functions as an inspection circuit, the circuit 501 is necessary when the circuit 111 performs inspection but not necessary after the inspection. Therefore, the circuit 501 can be provided as illustrated in FIG. 8A at the time of inspection, and the circuit 501 can be removed after the inspection is finished. When the circuit 501 is removed as shown in FIG. 8B, the wiring 202 and the wiring 203 are each in a floating state.

Figure 9A:
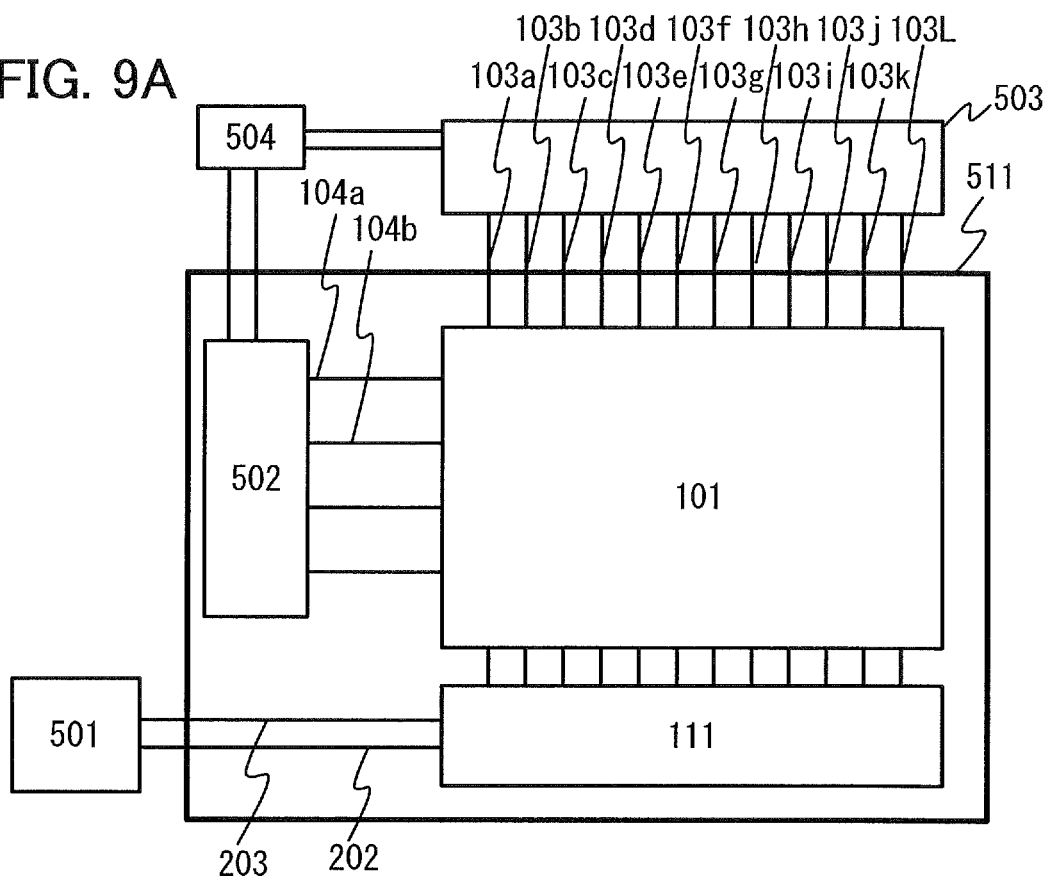
FIGS. 9A and 9B are circuit diagrams each illustrating a semiconductor device.
Figure 9B:
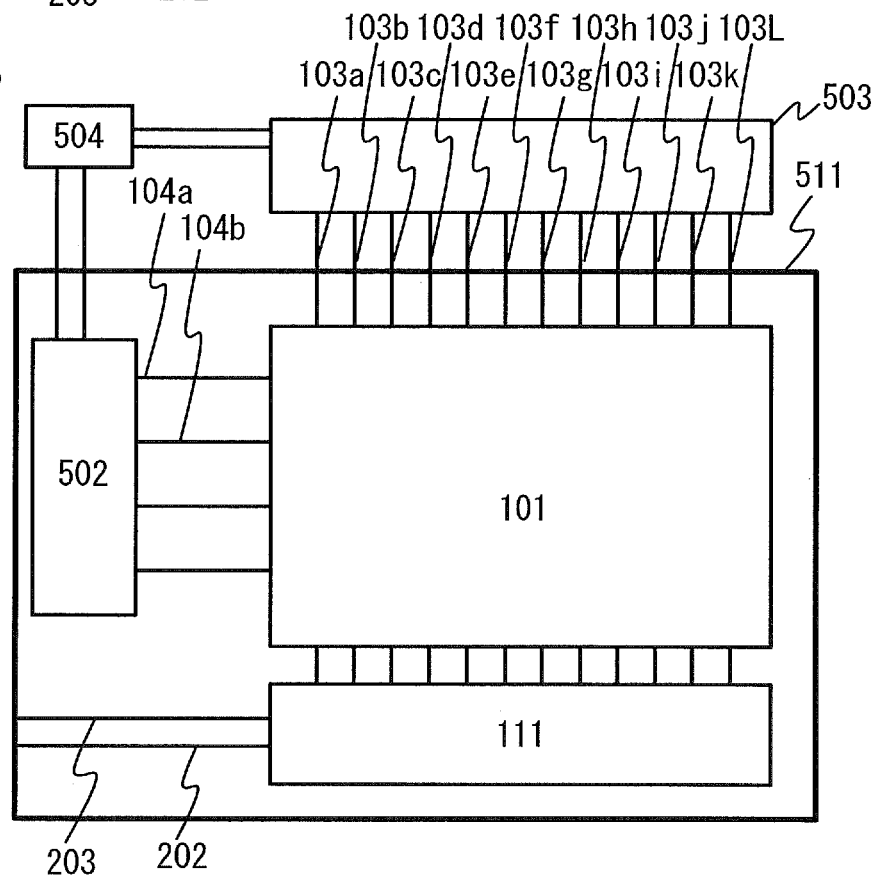

Note that the circuits 501, 502, 503, and 504 are provided over substrates different from the substrate 511 in FIGS. 8A and 8B; however, one embodiment of the present invention is not limited to these examples. For example, some of these circuits can be provided over the substrate 511. As an example, FIGS. 9A and 9B each illustrate an example of the case where the circuit 502 is provided over the substrate 511. Like FIG. 8A, FIG. 9A illustrates a structure including the circuit 501. Like FIG. 8B, FIG. 9B illustrates a structure without the circuit 501. That is, in FIGS. 9A and 9B, the circuit 111, the pixel portion 101, and the circuit 502 are formed over one substrate through the same process. For that reason, when the transistor in the pixel portion 101 includes an oxide semiconductor, transistors in the circuits 111 and 502 also include the oxide semiconductor. When the circuit 501 is removed as shown in FIG. 8B, the wiring 202 and the wiring 203 are each in a floating state.

By thus forming the circuit 502 over the same substrate as the pixel portion 101, costs can be reduced.

As an example different from FIGS. 9A and 9B, the circuit 503 or part of the circuit 503 can be provided over the substrate 511. As an example of part of the circuit 503, an analog switch (a transfer gate) can be connected to the wirings 103a to 103L. Similarly, the circuit 504 or part of the circuit 504 can be provided over the substrate 511.

Embodiment 4

In this embodiment, examples of a pixel included in the pixel portion 101 will be described.

Figure 10A:
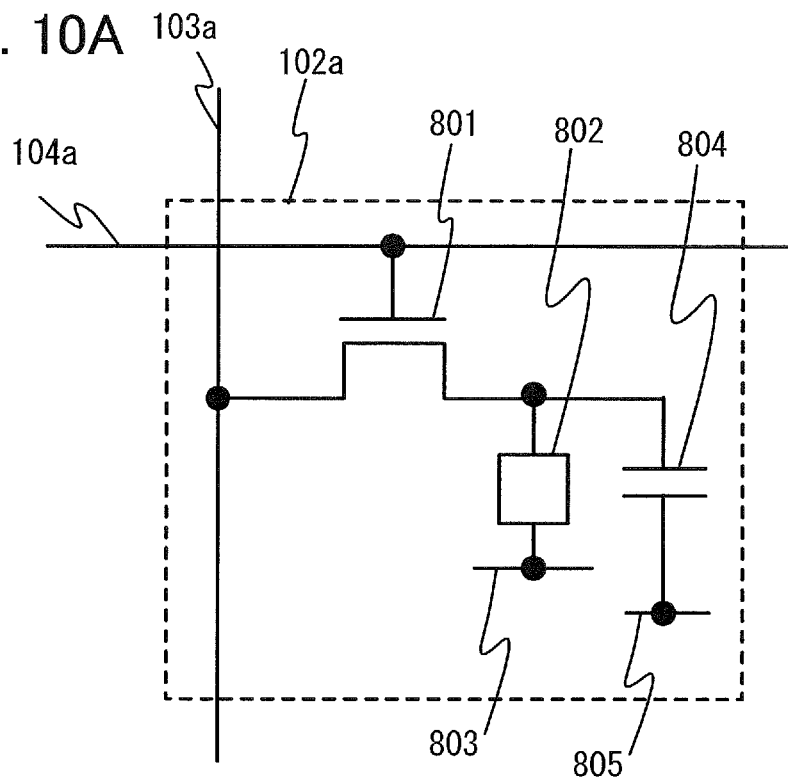
FIGS. 10A and 10B are circuit diagrams each illustrating a semiconductor device.

FIG. 10A illustrates an example of a circuit of the pixel 102a. A gate of a transistor 801 is connected to the wiring 104a. A first terminal of the transistor 801 is connected to the wiring 103a. A second terminal of the transistor 801 is connected to a first terminal of a display element 802. A second terminal of the display element 802 is connected to a wiring 803. A first terminal of a capacitor 804 is connected to the second terminal of the transistor 801. A second terminal of the capacitor 804 is connected to a wiring 805.

Here, the wirings 803 can be connected to each other in all the pixels.

Moreover, a predetermined voltage is supplied to the wiring 803. For that reason, the wiring 803 can have a function of a common wiring, a counter electrode, or the like.

The wirings 805 can be connected to each other in other pixels, for example, horizontal pixels. Moreover, a predetermined voltage is supplied to the wiring 805. For that reason, the wiring 805 can have a function of a common wiring, a capacitor wiring, or the like.

The transistor 801 can have a function of selecting whether or not to supply a signal to the display element 802 or the capacitor 804. Accordingly, the transistor 801 can have a switch function. Alternatively, the transistor 801 can have a function of a switching transistor (a transistor for switching) or a selection transistor.

Figure 10B:
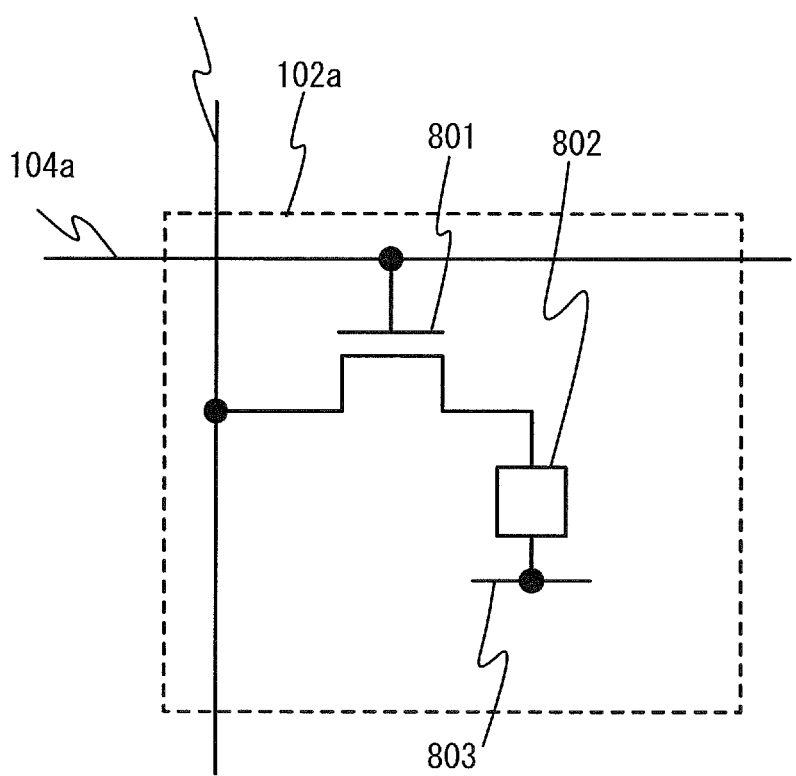

Note that the capacitor 804 can be omitted so that the aperture ratio is increased. FIG. 10B illustrates a circuit diagram in that case. By using a transistor with low off-state current, for example, a transistor including an oxide semiconductor as the transistor 801, a voltage applied to the display element 802 can be retained even when the capacitor 804 is omitted.

Figure 11A:
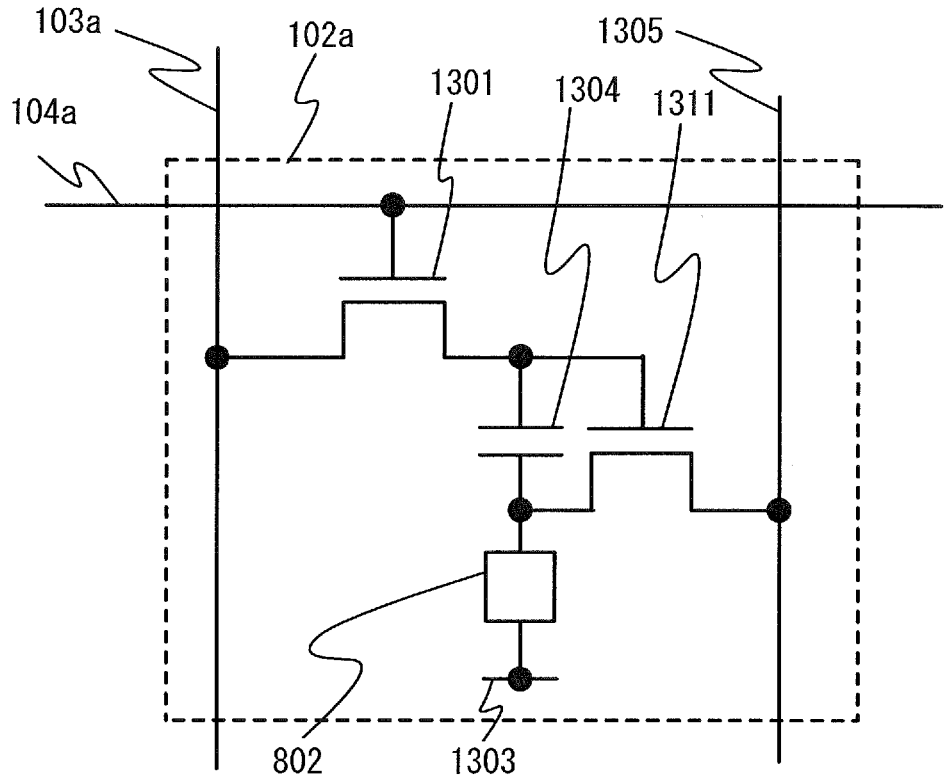
FIGS. 11A and 11B are circuit diagrams each illustrating a semiconductor device.

Note that examples of the pixel circuit are not limited to the circuits illustrated in FIGS. 10A and 10B. FIG. 11A illustrates another example of a pixel circuit. A gate of a transistor 1301 is connected to the wiring 104a. A first terminal of the transistor 1301 is connected to the wiring 103a. A second terminal of the transistor 1301 is connected to a gate of a transistor 1311. A first terminal of the transistor 1311 is connected to a wiring 1305. A second terminal of the transistor 1311 is connected to a first terminal of the display element 802. A second terminal of the display element 802 is connected to a wiring 1303. A first terminal of a capacitor 1304 is connected to the second terminal of the transistor 1301. A second terminal of the capacitor 1304 is connected to the second terminal of the transistor 1311.

Note that a wiring or a terminal to which the second terminal of the capacitor 1304 is connected is not limited to the example in FIG. 11A; the second terminal of the capacitor 1304 can be connected to another wiring, for example, the wiring 1305.

Here, the wirings 1303 can be connected to each other in all the pixels.

Moreover, a predetermined voltage is supplied to the wiring 1303. For that reason, the wiring 1303 can have a function of a common wiring, a counter electrode, a cathode wiring, a cathode line, or the like.

The wirings 1305 can be connected to each other in other pixels, for example, horizontal pixels or vertical pixels. Moreover, a predetermined voltage is supplied to the wiring 1305. For that reason, the wiring 1305 can have a function of a common wiring, a capacitor wiring, a power supply line, a current supply line, an anode line, or the like.

The transistor 1301 can have a function of selecting whether or not to supply a signal to the transistor 1311 or the capacitor 1304. Accordingly, the transistor 1301 can have a switch function. Alternatively, the transistor 1301 can have a function of a switching transistor or a selection transistor.

The transistor 1311 can have a switch function of selecting whether or not to supply a signal, a voltage, or a current to the display element 802; and a function of a current source for controlling the magnitude of the signal, voltage, or current. Alternatively, the transistor 1311 can have a function of a driving transistor.

Figure 11B:
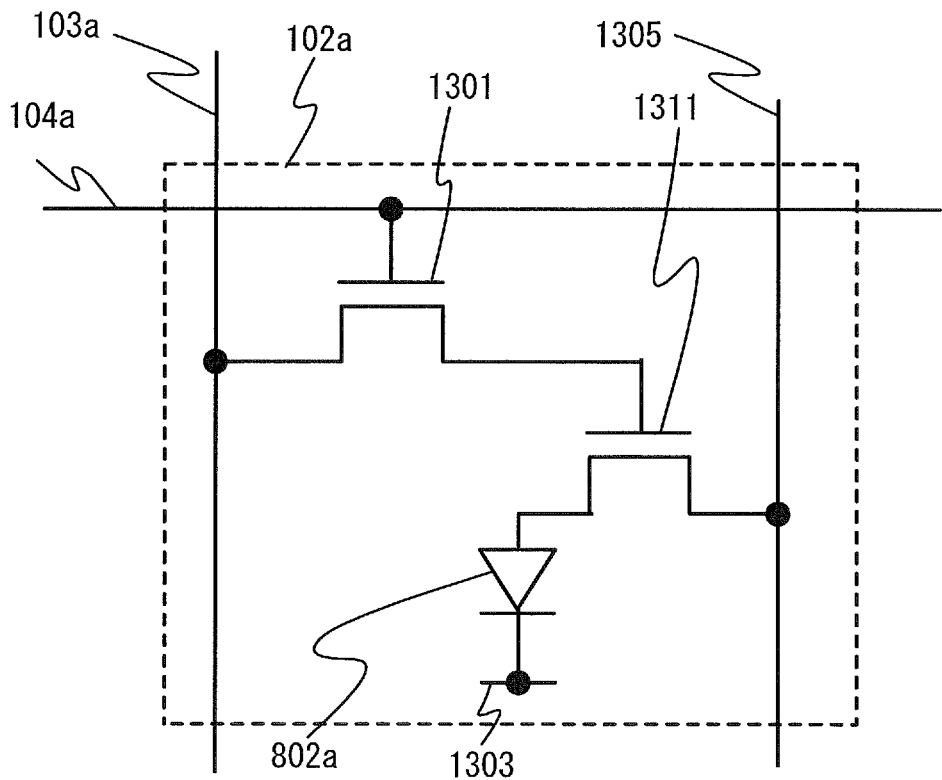

Note that the capacitor 1304 can be omitted so that the aperture ratio is increased. FIG. 11B illustrates a circuit diagram in that case. By using a transistor with low off-state current, for example, a transistor including an oxide semiconductor as the transistors 1301 and 1311, a voltage applied to the display element 802 can be retained even when the capacitor 1304 is omitted.

A variety of elements can be used as the display element 802, and the display element 802 can function as a light-emitting element in some cases. FIG. 11B illustrates a circuit diagram in the case where a light-emitting element 802a is used as a display element.

Examples of display elements are elements including a display medium whose contrast, luminance, reflectance, transmittance, or the like changes by electromagnetic action, such as an EL (electroluminescence) element (e.g., an EL element containing organic and inorganic materials, an organic EL element, and an inorganic EL element), an LED (e.g., a white LED, a red LED, a green LED, and a blue LED), a liquid crystal element, electronic ink, an electrophoretic element, and a carbon nanotube. An example of a display device including liquid crystal elements is a liquid crystal display. An example of a display device including electronic ink or electrophoretic elements is electronic paper.

An example of an EL element is an element including an anode, a cathode, and an EL layer placed between the anode and the cathode. Examples of an EL layer are a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed using an organic material, a layer formed using an inorganic material, a layer formed using an organic material and an inorganic material, a layer including a high-molecular material, a layer including a low-molecular material, and a layer including a high-molecular material and a low-molecular material. Note that various types of EL elements can be used without limitation to the above.

An example of a liquid crystal element is an element that controls transmission and non-transmission of light by optical modulation action of liquid crystals. The element can include a pair of electrodes and a liquid crystal layer. The optical modulation action of liquid crystals is controlled by an electric field applied to the liquid crystals (including a lateral electric field, a vertical electric field, and a diagonal electric field). Moreover, the following methods can be used for driving the liquid crystals, for example: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, a guest-host mode, and a blue phase mode. Note that various liquid crystal elements and driving methods can be used without limitation to the above.

Since there are few limitations on the layout of the transistors included in the circuit 111, the channel width (or the gate width) W of the transistors included in the circuit 111 (e.g., the transistors 201a to 201L) can be larger than the channel width (or the gate width) W of the transistor included in the pixel (e.g., the transistors 801, 1301, and 1311). In particular, a transistor including an oxide semiconductor has a low off-state current; therefore, an increase in the channel width (or the gate width) W causes fewer adverse effects. Further, when the channel width (or the gate width) W of the transistors included in the circuit 111 is increased, precharge and inspection can be rapidly performed. Similarly, the channel length (or the gate length) L of the transistors included in the circuit 111 (e.g., the transistors 201a to 201L) can be larger than the channel length (or the gate length) L of the transistor included in the pixel (e.g., the transistors 801, 1301, and 1311).

Embodiment 5

In this embodiment, a transistor in which a channel formation region is formed using an oxide semiconductor is used as each of the transistors 201a to 201L, the transistor 801, the transistor 1301, the transistor 1311, and the like.

Examples of oxide semiconductors are an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, and an In—Mg—O-based oxide semiconductor which are oxides of two metal elements; an In—O-based oxide semiconductor, a Sn—O-based oxide semiconductor, and a Zn—O-based oxide semiconductor. Further, the above-described metal oxide semiconductor may contain $SiO_2$.

As the oxide semiconductor, a material expressed by $InMO_3(ZnO)_m$ (m>0) can be used. Here, M represents one or more metal elements selected from Ga, Al, Mn, and Co. For example, M can be Ga, Ga and Al, Ga and Mn, or Ga and Co. An oxide semiconductor whose composition formula is represented by $InMO_3(ZnO)_m$ (m>0) where Ga is included as M is referred to as an In—Ga—Zn—O oxide semiconductor, and a thin film thereof is also referred to as an In—Ga—Zn—O-based film.

One embodiment of a method for manufacturing a transistor in which a channel formation region is formed using an oxide semiconductor will be described with reference to FIGS. 12A to 12D.

FIGS. 12A to 12D illustrates an example of a cross-sectional structure of a transistor. A transistor 410 illustrated in FIGS. 12A to 12D has a bottom-gate structure called a channel-etched structure.

Although a single-gate transistor is illustrated in FIGS. 12A to 12D, a multi-gate transistor including a plurality of channel formation regions can be formed as needed.

Steps for manufacturing the transistor 410 over a substrate 400 will be described below with reference to FIGS. 12A to 12D.

First, a conductive film is formed over the substrate 400 having an insulating surface, and then, a gate electrode layer 411 is formed through a first photolithography process.

Although there is no particular limitation on a substrate that can be used as the substrate 400 having an insulating surface, the substrate needs to have heat resistance high enough to at least withstand heat treatment to be performed later. For example, a glass substrate made of barium borosilicate glass, aluminoborosilicate glass, or the like can be used. A glass substrate whose strain point is 730° C. or more is preferably used when the temperature of the heat treatment performed later is high.

An insulating film serving as a base film may be provided between the substrate 400 and the gate electrode layer 411. The base film has a function of preventing diffusion of an impurity element from the substrate 400, and can be formed with a single-layer structure or a layered structure using one or more of a silicon nitride film, a silicon oxide film, a silicon nitride oxide film, and a silicon oxynitride film.

The gate electrode layer 411 can be formed with a single-layer structure or a layered structure using a metal material such as molybdenum, titanium, chromium, tantalum, tungsten, aluminum, copper, neodymium, or scandium or an alloy material containing any of these materials as its main component.

Then, a gate insulating layer 402 is formed over the gate electrode layer 411.

The gate insulating layer 402 can be formed with a single-layer structure or a layered structure using a silicon oxide layer, a silicon nitride layer, a silicon oxynitride layer, a silicon nitride oxide layer, or an aluminum oxide layer by a plasma CVD method, a sputtering method, or the like. Furthermore, a high-k material such as hafnium oxide (HfOx) or tantalum oxide (TaOx) can be used as the gate insulating layer. The thickness of the gate insulating layer 402 is 100 nm to 500 nm. In the case of employing a layered structure, the gate insulating layer 402 is a stack, for example, of a first gate insulating layer with a thickness of 50 nm to 200 nm and a second gate insulating layer with a thickness of 5 nm to 300 nm over the first gate insulating layer.

In this embodiment, a silicon oxynitride layer having a thickness of 100 nm or less is formed by plasma CVD as the gate insulating layer 402.

Further, as the gate insulating layer 402, a silicon oxynitride film may be formed using a high-density plasma apparatus. Here, a high-density plasma apparatus refers to an apparatus that can realize a plasma density of $1 \times 10^{11}/\text{cm}^3$ or higher. For example, plasma is generated by applying a microwave power of 3 kW 6 kW, and the insulating film is formed. The insulating film formed by the high-density plasma apparatus can have a uniform thickness, and thus has excellent step coverage. Moreover, the thickness of a thin insulating film formed using the high-density plasma apparatus can be precisely controlled.

The insulating film obtained with the high-density plasma apparatus is greatly different from an insulating film obtained with a conventional parallel plate PCVD apparatus. The etching rate of the insulating film obtained with the high-density plasma apparatus is lower than that of the insulating film obtained with a parallel plate PCVD apparatus by 10% or more or 20% or more in the case where the etching rates with the same etchant are compared to each other. Thus, it can be said that the insulating film obtained with the high-density plasma apparatus is a dense film.

The oxide semiconductor that becomes an i-type or substantially i-type oxide semiconductor (a purified oxide semiconductor) in a later step is extremely sensitive to the interface state or interface electric charge; therefore, the interface with the gate insulating layer is important. For that reason, the gate insulating layer (GI) that is in contact with the purified oxide semiconductor needs to have high quality. Therefore, high-density plasma CVD with use of microwaves (2.45 GHz) is preferably employed since a dense and high-quality insulating film having high withstand voltage can be formed. When the purified oxide semiconductor and the high-quality gate insulating layer are in close contact with each other, the interface state density can be reduced and favorable interface characteristics can be obtained. It is important that the gate insulating layer have lower interface state density with an oxide semiconductor and a favorable interface as well as having favorable film quality as a gate insulating layer.

Figure 12A:
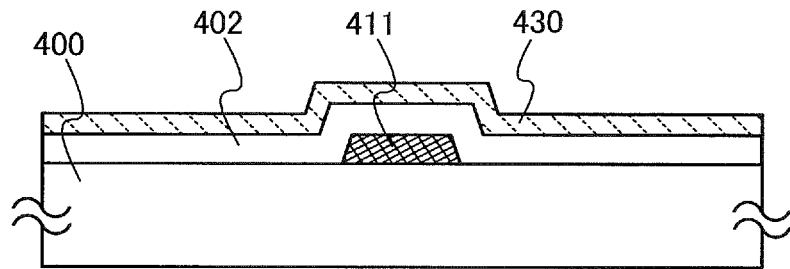
FIGS. 12A to 12D are cross-sectional views each illustrating a semiconductor device.
Figure 12B:
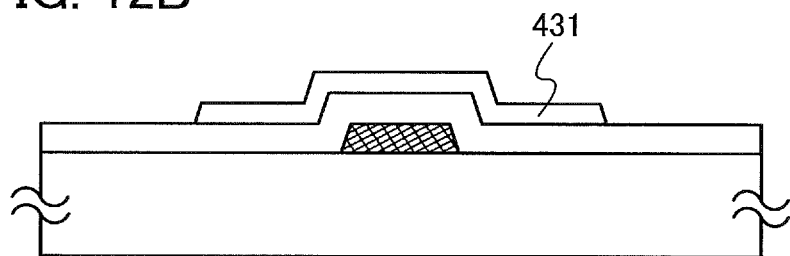
Figure 12C:
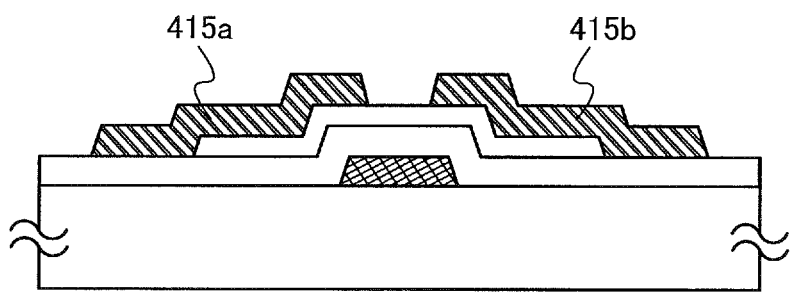
Figure 12D:
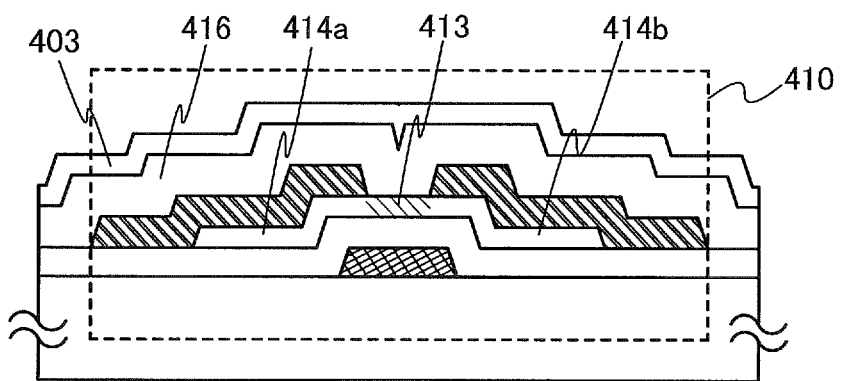

Then, an oxide semiconductor film 430 is formed to a thickness of 2 nm to 200 nm over the gate insulating layer 402. As the oxide semiconductor film 430, an In—Ga—Zn—O-based oxide semiconductor film, an In—Zn—O-based oxide semiconductor film, or the like is used. In this embodiment, the oxide semiconductor film 430 is formed by a sputtering method with the use of an In—Ga—Zn—O-based oxide semiconductor target. A cross-sectional view at this stage is illustrated in FIG. 12A. Alternatively, the oxide semiconductor film 430 can be formed by a sputtering method in a rare gas (typically argon) atmosphere, an oxygen atmosphere, or a mixed atmosphere containing a rare gas (typically argon) and oxygen.

Here, film deposition is performed using a metal oxide target containing In, Ga, and Zn ($In_2O_3:Ga_2O_3:ZnO=1:1:1$ [molar ratio]). The deposition conditions are set as follows: the distance between the substrate 400 and the target is 100 mm; the pressure is 0.2 Pa; the direct current (DC) power supply is 0.5 kW; and the atmosphere is a mixed atmosphere of argon and oxygen (argon:oxygen=30 sccm: 20 sccm and the flow rate ratio of oxygen is 40%). Note that a pulse direct current (DC) power supply is preferably used because powder substances generated at the time of deposition can be reduced and the film thickness can be made uniform. The In—Ga—Zn—O-based film is formed to a thickness of 5 nm to 200 nm. In this embodiment, as the oxide semiconductor film, a 20-nm-thick In—Ga—Zn—O-based film is formed by a sputtering method with the use of an In—Ga—Zn—O-based metal oxide target. Then, the oxide semiconductor film 430 is processed into an island-shaped oxide semiconductor layer through a second photolithography process.

Next, dehydration or dehydrogenation of the oxide semiconductor layers is performed. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer at 450° C. for one hour in a nitrogen atmosphere, and then, the oxide semiconductor layer is not exposed to the air so that entry of water and hydrogen into the oxide semiconductor layer is prevented; thus, an oxide semiconductor layer 431 is obtained (see FIG. 12B).

Note that a heat treatment apparatus is not limited to an electric furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas that does not react with an object to be processed by heat treatment, for example, nitrogen or a rare gas such as argon is used.

For example, as the first heat treatment, GRTA by which the substrate is moved into an inert gas heated to a high temperature as high as 650° C. to 700° C., heated for several minutes, and moved out of the inert gas heated to the high temperature may be performed. With GRTA, high-temperature heat treatment for a short period of time can be achieved.

Note that in the first heat treatment, it is preferable that water, hydrogen, and the like be not included in the atmosphere of nitrogen, a rare gas such as helium, neon, or argon, or dry air. For example, the purity of nitrogen or a rare gas such as helium, neon, or argon, which is introduced into the heat treatment apparatus, is preferably 6N (99.9999%) or more, more preferably 7N (99.99999%) or more (i.e., impurity concentration is preferably 1 ppm or lower, more preferably 0.1 ppm or lower).

The first heat treatment for the oxide semiconductor layer may be performed on the oxide semiconductor film 430 before being processed into the island-shaped oxide semiconductor layer. In that case, after the first heat treatment, the substrate is taken out of the heat treatment apparatus, and then the second photolithography process is performed.

In the case where an opening portion is formed in the gate insulating layer 402, the step of forming the opening portion may be performed before or after the oxide semiconductor film 430 is subjected to dehydration or dehydrogenation treatment.

Note that the etching of the oxide semiconductor film 430 is not limited to wet etching and dry etching may also be used.

As an etching gas used for dry etching of the oxide semiconductor film 430, a gas containing chlorine (e.g., chlorine ($Cl_2$) or boron chloride ($BCl_3$)) is preferably used.

As an etchant used for wet etching of the oxide semiconductor film 430, a mixed solution of phosphoric acid, acetic acid, and nitric acid; ITO07N (produced by Kanto Chemical Co., Inc.); or the like can be used.

Next, a metal conductive film is formed over the gate insulating layer 402 and the oxide semiconductor layer 431. The metal conductive film may be formed by a sputtering method or a vacuum evaporation method. Examples of a material for the metal conductive film are an element selected from aluminum (Al), chromium (Cr), copper (Cu), tantalum (Ta), titanium (Ti), molybdenum (Mo), tungsten (W), neodymium (Nd), and scandium (Sc); an alloy containing any of these elements as a component; and an alloy containing any of these elements in combination. A nitride film of any of these elements may be used. Alternatively, one or more materials selected from manganese (Mn), magnesium (Mg), zirconium (Zr), beryllium (Be), and yttrium (Y) may be used. The metal conductive film may have a single-layer structure or a layered structure of two or more layers. For example, the metal conductive film can have a single-layer structure of an aluminum film containing silicon; a two-layer structure of an aluminum film and a titanium film stacked thereover; or a three-layer structure in which a titanium film, an aluminum film, and a titanium film are stacked in this order.

When heat treatment is performed after formation of the metal conductive film, the metal conductive film preferably has heat resistance high enough to withstand the heat treatment.

Through a third photolithography process, a resist mask is formed over the metal conductive film and etching is selectively performed, so that a source electrode layer 415*a* and a drain electrode layer 415*b* are formed. Then, the resist mask is removed (see FIG. 12C).

In this embodiment, a titanium film is used as the metal conductive film, an In—Ga—Zn—O-based oxide is used for the oxide semiconductor layer 431, and an ammonia peroxide mixture (31 wt % hydrogen peroxide solution: 28 wt % ammonia water:water=5:2:2) is used as the etchant for the titanium film.

Note that through the third photolithography process, only part of the oxide semiconductor layer 431 is sometimes etched so that a groove (a recessed portion) is formed in the oxide semiconductor layer.

In order to reduce the number of photomasks used in the photolithography processes and reduce the number of photolithography processes, an etching step may be performed with the use of a multi-tone mask which is a light-exposure mask through which light is transmitted to have a plurality of intensities. Since a resist mask formed using a multi-tone mask has a plurality of thicknesses and can be further changed in shape by performing ashing, the resist mask can be used in a plurality of etching steps to provide different patterns. Therefore, a resist mask corresponding to at least two kinds of different patterns can be formed by one multi-tone mask. Thus, the number of light-exposure masks can be reduced and the number of corresponding photolithography processes can be also reduced, so that the manufacturing process can be simplified.

Next, plasma treatment using a gas such as nitrous oxide ($N_2O$), nitrogen ($N_2$), or argon (Ar) is performed. By this plasma treatment, absorbed water and the like attached to an exposed surface of the oxide semiconductor layer are removed. Plasma treatment may be performed using a mixture gas of oxygen and argon.

After the plasma treatment, an oxide insulating layer 416 that is in contact with part of the oxide semiconductor layer and serves as a protective insulating film is formed without exposure to the air.

The oxide insulating layer 416 has a thickness of at least 1 nm and can be formed as appropriate by a sputtering method or the like with which impurities such as water and hydrogen are not mixed into the oxide insulating layer 416. When hydrogen is contained in the oxide insulating layer 416, entry of the hydrogen to the oxide semiconductor layer is caused, thereby making a backchannel of the oxide semiconductor layer 431 have a lower resistance (have n-type conductivity) and forming parasitic channels. Therefore, it is important that a formation method in which hydrogen is not used is employed in order to form the oxide insulating layer 416 containing as little hydrogen as possible.

In this embodiment, a 200-nm-thick silicon oxide film is deposited as the oxide insulating layer 416 by a sputtering method. The substrate temperature in film formation is higher than or equal to room temperature and lower than or equal to 300° C. and is 100° C. in this embodiment. The silicon oxide film can be formed by a sputtering method in a rare gas (typically argon) atmosphere, an oxygen atmosphere, or an atmosphere of a rare gas (typically argon) and oxygen. As a target, a silicon oxide target or a silicon target can be used. For example, the silicon oxide film can be formed using a silicon target by a sputtering method in an atmosphere including oxygen and nitrogen.

Next, second heat treatment (preferably at 200° C. to 400° C., for example, at 250° C. to 350° C.) is performed in an inert gas atmosphere, a dry air atmosphere, or an oxygen gas atmosphere. For example, the second heat treatment is performed at 250° C. for one hour in a nitrogen atmosphere. Through the second heat treatment, part of the oxide semiconductor layer (a channel formation region) is heated while being in contact with the oxide insulating layer 416. Thus, oxygen is supplied to part of the oxide semiconductor layer (the channel formation region). Moreover, in the vicinity of the interface between the source electrode layer 415*a* or the drain electrode layer 415*b* and the oxide semiconductor layer, oxygen is diffused into the source electrode layer 415*a* or the drain electrode layer 415*b*. Accordingly, a source region 414*a* and a drain region 414*b* are formed.

Through the above steps, the oxide semiconductor layer is subjected to the heat treatment for dehydration or dehydrogenation, and then, part of the oxide semiconductor layer (the channel formation region) is selectively made to be in an oxygen excess state. Note that the part of the oxide semiconductor layer in an oxygen excess state is shown as a region 413 in FIG. 12D. Through the above-described process, the transistor 410 is formed.

Further, heat treatment may be performed at 100° C. to 200° C. for 1 hour to 30 hours in the air. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature.

A protective insulating layer may be further formed over the oxide insulating layer 416. For example, a silicon nitride film is formed by an RF sputtering method. Since an RF sputtering method has high productivity, it is preferably used as a method for forming the protective insulating layer. As the protective insulating layer, an inorganic insulating film that does not include impurities such as moisture, a hydrogen ion, and OW and blocks entry of these from the outside is used. For example, a silicon nitride film, an aluminum nitride film, a silicon nitride oxide film, or an aluminum oxynitride film is used. In this embodiment, a protective insulating layer 403 is formed using a silicon nitride film as the protective insulating layer (see FIG. 12D).

The oxide semiconductor layer in the transistor 410 in this embodiment is an intrinsic (i-type) or substantially intrinsic oxide semiconductor layer obtained by removal of hydrogen, which is an n-type impurity, for purification so that the oxide semiconductor layer contains impurities other than the main component as little as possible. In other words, the oxide semiconductor layer in this embodiment is a purified i-type (intrinsic) semiconductor or a substantially intrinsic semiconductor obtained by removing impurities such as hydrogen and water as much as possible, not by adding an impurity. This enables the Fermi level (Ef) to be at the same level as the intrinsic Fermi level (Ei).

It is said that an oxide semiconductor has a band gap (Eg) of 3.15 eV and an electron affinity (x) of 4.3 eV. The work function of titanium (Ti) contained in the source electrode layer and the drain electrode layer is substantially equal to the electron affinity (x) of an oxide semiconductor. In that case, a Schottky barrier for electrons is not formed at an interface between the metal and the oxide semiconductor.

For example, even when a transistor has a channel width W of $1\times10^4$ μm and a channel length L of 3 μm, the off-state current can be $10^{-13}$ A or less and the subthreshold swing value (S value) can be 0.1 V/decade at room temperature (with a 100-nm-thick gate insulating layer).

As described above, the oxide semiconductor is purified so as to contain impurities which are not its main components as little as possible; thus, the transistor 410 can operate in a favorable manner.

The above-described oxide semiconductor is a purified and electrically intrinsic (i-type) oxide semiconductor made by the following manner: in order to suppress variations in electrical characteristics, impurities that cause variations, such as hydrogen, moisture, a hydroxyl group, and hydride (also referred to as hydrogen compound), are removed intentionally; and oxygen which is a main component of the oxide semiconductor and is reduced in the step of removing impurities is supplied.

Therefore, it is preferable that the oxide semiconductor contain as little hydrogen as possible. Further, the purified oxide semiconductor has very few carriers (close to zero) and the carrier density is less than $1\times10^{12}/cm^3$, preferably less than $1\times10^{11}/cm^3$. In other words, the carrier concentration of the oxide semiconductor layer is made as close to zero as possible. Since the oxide semiconductor layer includes extremely few carriers, the off-state current of the transistor can be reduced. It is preferable that off-state current be as low as possible. The off-state current per channel width (W) of 1 μm of the transistor is 100 aA/μm or less, preferably 10 zA/μm or less (zA: zeptoampere), further preferably 1 zA/μm or less. Further, since there is no pn junction and no hot carrier degradation, electric characteristics of the transistor are not adversely affected by them.

As described above, the off-state current can be extremely low in a transistor in which an oxide semiconductor that is purified by drastically removing hydrogen contained therein is used for a channel formation region. In other words, in circuit design, the oxide semiconductor layer can be regarded as an insulator when the transistor is off. On the other hand, when the transistor is on, the current supply capability of the oxide semiconductor layer is expected to be higher than that of a semiconductor layer formed of amorphous silicon.

Design is performed assuming that the off-state current of a thin film transistor formed using low-temperature polysilicon is approximately 10000 times as high as that of a transistor formed using an oxide semiconductor. Thus, a period for holding voltage of the transistor formed using an oxide semiconductor can be approximately 10000 times as long as that of the thin film transistor formed using low-temperature polysilicon, when these transistors have an equivalent storage capacitance (of about 0.1 pF). For example, when moving images are displayed at 60 frames per second, a holding period for one signal writing can be approximately 160 seconds, which is 10000 times as long as that of the thin film transistor formed using low-temperature polysilicon. In this manner, a still image can be displayed on a display portion even by less frequent writing of image signals.

Embodiment 6

In this embodiment, an example of a pixel and a method for driving the pixel will be described. Specifically, an example of a pixel that includes a display element with memory properties and an example of a method for driving the pixel will be described.

Figure 13A:
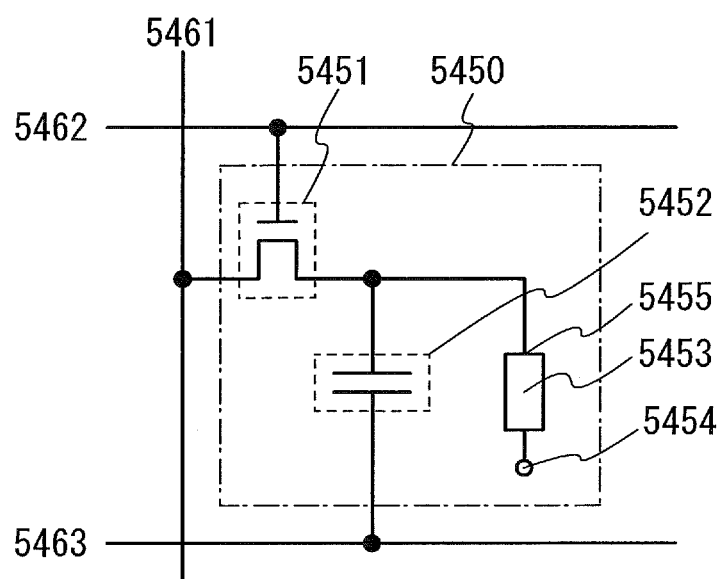
FIG. 13A is a circuit diagram illustrating a display device.

FIG. 13A illustrates an example of a circuit diagram of a pixel. A pixel 5450 includes a transistor 5451, a capacitor 5452, and a display element 5453. A first terminal of the transistor 5451 is connected to a wiring 5461. A second terminal of the transistor 5451 is connected to one electrode of the capacitor 5452 and one electrode of the display element 5453 (also referred to as a pixel electrode). A gate of the transistor 5451 is connected to a wiring 5462. The other electrode of the capacitor 5452 is connected to a wiring 5463. The other electrode of the display element 5453 is connected to an electrode 5454 (e.g., a common electrode, a counter electrode, or a cathode electrode).

Note that an electrode 5455 refers to one electrode of the display element 5453.

When FIG. 13A is compared to FIG. 10A, the transistor 5451 corresponds to the transistor 801; the display element 5453, the display element 802; the capacitor 5452, the capacitor 804; the wiring 5462, the wiring 104a; and the wiring 5461, the wiring 103a.

The display element 5453 preferably has memory properties. Examples of the display element 5453 and a method for driving the display element 5453 are microcapsule electrophoresis, microcup electrophoresis, horizontal electrophoresis, vertical electrophoresis, twisting ball, liquid powder display, electronic liquid powder (registered trademark), a cholesteric liquid crystal element, a chiral nematic liquid crystal, an anti-ferroelectric liquid crystal, and a polymer dispersed liquid crystal.

Since a voltage applied to the display element 5453 is very high, a transistor for driving the display element 5453 needs to have high withstand voltage. Moreover, the off-state current of the transistor needs to be low even when such a high voltage is applied. By using a transistor including an oxide semiconductor as the transistor, the transistor can have high withstand voltage and low off-state current.

Figure 13B:
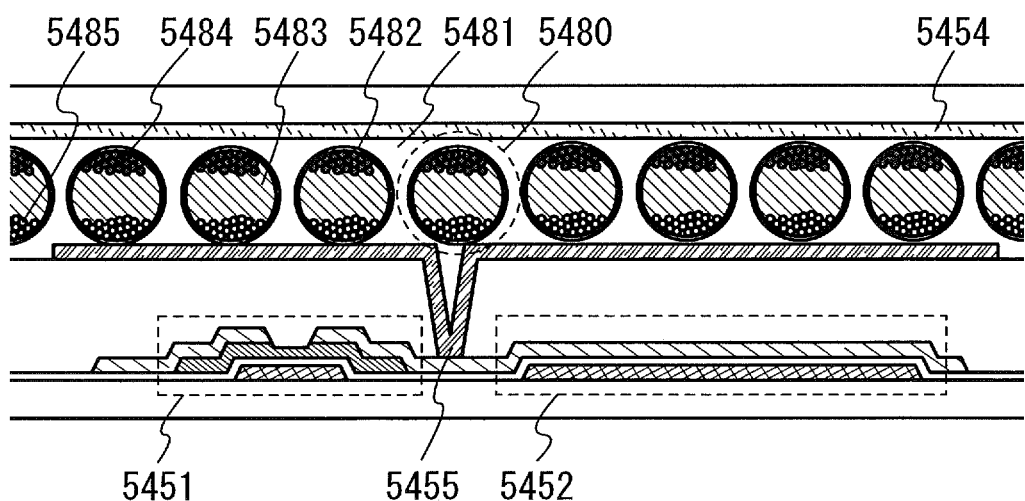
FIG. 13B is a cross-sectional view illustrating a display device.

FIG. 13B is a cross-sectional view of a pixel using microcapsule electrophoresis. A plurality of microcapsules 5480 are placed between an electrode 5454 and an electrode 5455. The plurality of microcapsules 5480 are fixed by a resin 5481. The resin 5481 functions as a binder. The resin 5481 preferably has light-transmitting properties. A space formed by the electrode 5454, the electrode 5455, and the microcapsule 5480 can be filled with a gas such as air or an inert gas. In such a case, a layer including a glue, an adhesive, or the like is preferably formed on one or both of the electrodes 5454 and 5455 to fix the microcapsules 5480.

The microcapsule 5480 includes a film 5482, a liquid 5483, particles 5484, and particles 5485. The liquid 5483, the particles 5484, and the particles 5485 are sealed in the film 5482. The film 5482 has light-transmitting properties. The liquid 5483 functions as a dispersion liquid. The particles 5484 and the particles 5485 can be dispersed in the film 5482 by the liquid 5483. It is preferable that the liquid 5483 have light-transmitting properties and be not colored. The particle 5484 and the particle 5485 have different colors. For example, it is preferable that one of the particle 5484 and the particle 5485 be black and the other of the particle 5484 and the particle 5485 be white. Note that the particle 5484 and the particle 5485 are charged so that their electric charge densities or polarities are different from each other. For example, one of the particle 5484 and the particle 5485 is positively charged and the other of the particle 5484 and the particle 5485 is negatively charged. Thus, when a potential difference occurs between the electrode 5454 and the electrode 5455, the particle 5484 and the particle 5485 move in accordance with the direction of electric fields. Accordingly, the reflectance of the display element 5453 is changed, so that the gray level can be controlled. Note that the structure of the microcapsule 5480 is not limited to the above-described structure. For example, the liquid 5483 can be colored. As another example, as particles sealed in the film 5482, one kind of particles or three kinds or more of particles can be used. As another example, colors of the particle 5484 and the particle 5485 can be selected from red, green, blue, cyan, magenta, yellow emerald green, vermillion, and the like in addition to white and black.

The film 5482 is formed using a light-transmitting material (e.g., a polymer resin such as an acrylic resin (e.g., poly(methyl methacrylate) and poly(ethyl methacrylate)), a urea resin, or gum arabic), for example. Note that the film 5482 is preferably gelatinous. By using such a film 5482, the plasticity, bending strength, mechanical strength, and the like can be improved, leading to improvement in flexibility. Alternatively, the microcapsules 5480 can be uniformly arranged with no gap therebetween over a substrate such as film.

A light-transmitting oily liquid is preferably used as the liquid 5483. Specific examples of the liquid 5483 are an alcohol-based solvent (e.g., methanol and ethanol), ester (e.g., ethyl acetate and butyl acetate), aliphatic hydrocarbon (e.g., ketone such as acetone, methyl ethyl ketone, and methyl isobutyl ketone; pentane, hexane, and octane), alicyclic hydrocarbon (e.g., cyclohexane and methylcyclohexane), aromatic hydrocarbon such as benzene having a long-chain alkyl group (e.g., benzene, toluene, and xylene), halogenated hydrocarbon (e.g., methylene chloride and chloroform), carboxylate salt, water, and other kinds of oils. Other examples of the liquid 5483 are a mixture of two or more of the above-described materials, a combination of a surface active agent or the like and one of the above materials, and a combination of a surface active agent or the like and a mixture of two or more of the above materials.

Each of the particle 5484 and the particle 5485 is formed using a pigment. The pigments included in the particle 5484 and the particle 5485 preferably have different colors. For example, it is preferable that the particle 5484 be formed using a black pigment and the particle 5485 be formed using a white pigment. Examples of the black pigment are aniline black and carbon black. Examples of the white pigment are titanium dioxide, zinc white (zinc oxide), and antimony trioxide. Note that it is possible to add, to the above-described pigment, a charge controlling agent (e.g., electrolyte, a surface active agent, metallic soap, resin, rubber, oil, varnish, or a compound), a dispersing agent (e.g., a titanium-based coupling agent, an aluminum-based coupling agent, or a silane-based coupling agent), a lubricant agent, a stabilizing agent, or the like.

Figure 14A:
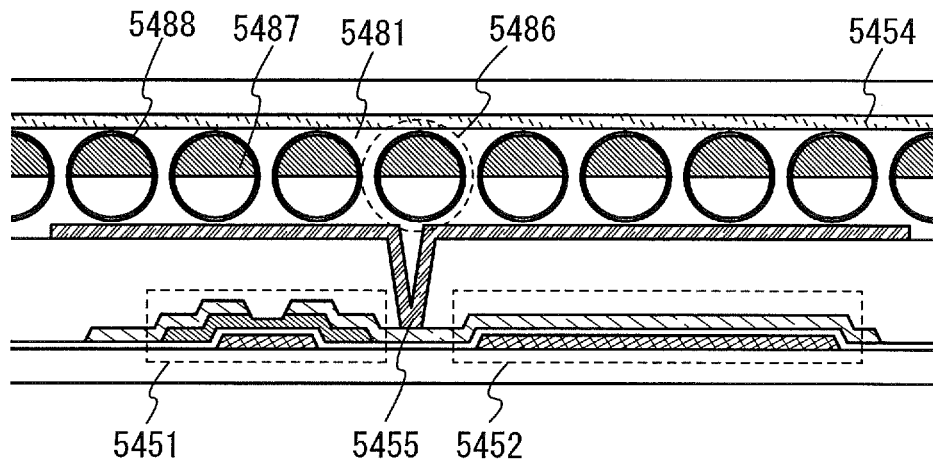
FIGS. 14A to 14C are cross-sectional views each illustrating a display device.

FIG. 14A is a cross-sectional view of a pixel in the case where a twisting ball display method is used for the display element 5453. In the twisting ball display method, the reflectance is changed by rotation of a display element in order to control the gray level. The difference from FIG. 13B is that instead of the microcapsule 5480, a twisting ball 5486 is placed between the electrode 5454 and the electrode 5455. The twisting ball 5486 includes a particle 5487 and a cavity 5488 formed around the particle 5487. The particle 5487 is a spherical particle in which a surface of one hemisphere is colored in a given color and a surface of the other hemisphere is colored in a different color. Here, the particle 5487 has a white hemisphere and a black hemisphere. Note that there is a difference in electric charge density or polarity between the two hemispheres. For that reason, by generating a potential difference between the electrode 5454 and the electrode 5455, the particle 5487 can be rotated in accordance with the direction of electric fields. The cavity 5488 is filled with a liquid. As the liquid, a liquid similar to the liquid 5483 can be used. Note that the structure of the twisting ball 5486 is not limited to the structure illustrated in FIG. 14A. For example, the twisting ball 5486 can be a cylinder, an ellipse, or the like.

Figure 14B:
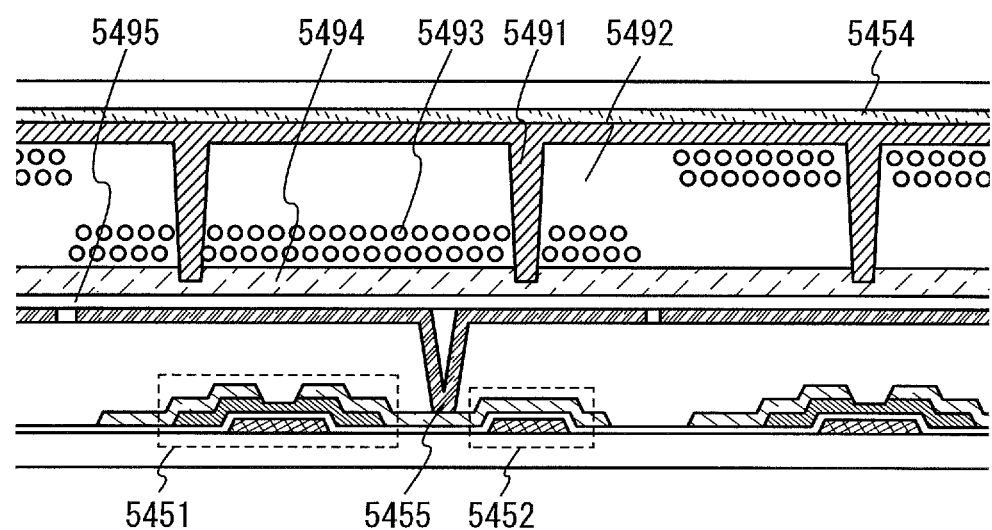

FIG. 14B is a cross-sectional view of a pixel in the case where a microcup electrophoresis method is used for the display element 5453. A microcup array can be formed in the following manner: a microcup 5491 that is formed using a UV curable resin or the like and has a plurality of recessed portions is filled with charged pigment particles 5493 dispersed in a dielectric solvent 5492, and sealing is performed with a sealing layer 5494. An adhesive layer 5495 is preferably formed between the sealing layer 5494 and the electrode 5455. As the dielectric solvent 5492, a colorless solvent can be used or a colored solvent of red, blue, or the like can be used. This embodiment shows the case where one kind of charged pigment particles is used; alternatively, two or more kinds of charged pigment particles may be used. The microcup has a wall by which cells are separated, and thus has sufficiently high resistance to shock and pressure. Moreover, since the components of the microcup are tightly sealed, adverse effects due to change in environment can be reduced.

Figure 14C:
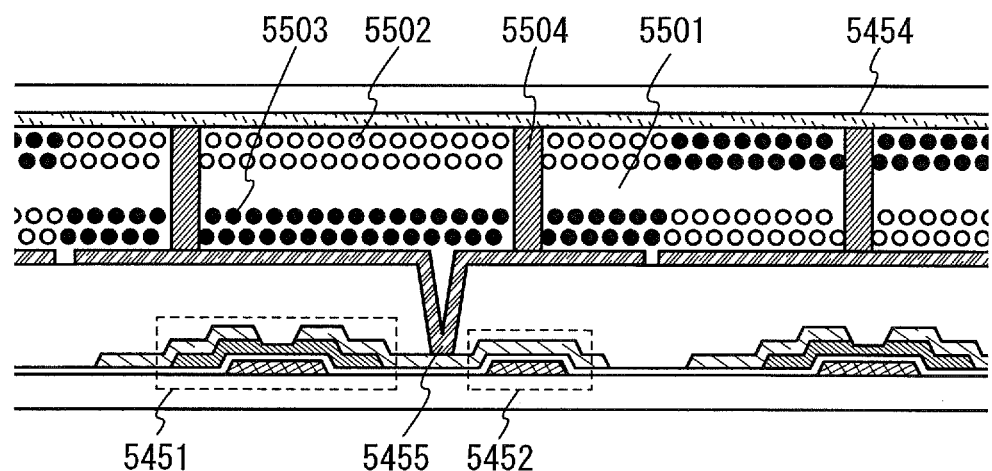

FIG. 14C is a cross-sectional view of a pixel in the case where an electronic liquid powder (registered trademark) display method is used for the display element 5453. The electronic liquid powder has fluidity and is a substance having properties of fluid and properties of a particle. In this method, cells are separated by partitions 5504, and electronic liquid powders 5502 and electronic liquid powders 5503 are placed in the cell. As the electronic liquid powder 5502 and the electronic liquid powder 5503, a white particle and a black particle are preferably used. Note that the kinds of the electronic liquid powders 5502 and 5503 are not limited thereto. For example, colored particles of two colors which are not white and black can be used as the electronic liquid powders 5502 and 5503. As another example, one of the electronic liquid powder 5502 and the electronic liquid powder 5503 can be omitted.

As illustrated in FIG. 13A, a signal is input to the wiring 5461. Specifically, a signal for controlling the gray level of the display element 5453 (e.g., a video signal) is input to the wiring 5461. Accordingly, the wiring 5461 has a function of a signal line or a source signal line (also referred to as a video signal line or a source line). A signal is input to the wiring 5462. Specifically, a signal for controlling a conduction state of the transistor 5451 (e.g., a gate signal, a scan signal, or a selection signal) is input to the wiring 5462. Accordingly, the wiring 5462 has a function of a signal line or a gate signal line (also referred to as a scan signal line or a gate line). A predetermined voltage is supplied to the wiring 5463. The wiring 5463 is connected to the capacitor 5452. Accordingly, the wiring 5463 has a function of a power supply line or a capacitor line. A predetermined voltage is supplied to the electrode 5454. The electrode 5454 is often shared with a plurality of pixels or all the pixels. Accordingly, the electrode 5454 has a function of a common electrode (such as a counter electrode or a cathode electrode).

Note that the signals or voltages input to the wirings 5461 to 5463 and the electrode 5454 are not limited to the above, and various other signals or voltages can be input. For example, a signal can be input to the wiring 5463. Thus, the potential of the electrode 5455 can be controlled, so that the amplitude voltage of a signal input to the wiring 5461 can be reduced. Accordingly, the wiring 5463 can have a function of a signal line. As another example, by changing a voltage supplied to the electrode 5454, a voltage applied to the display element 5453 can be adjusted. Thus, the amplitude voltage of a signal input to the wiring 5461 can be reduced.

The transistor 5451 has a function of controlling electrical continuity between the wiring 5461 and the electrode 5455, a function of controlling the timing of supplying the potential of the wiring 5461 to the electrode 5455, and/or a function of controlling the timing of selecting the pixel 5450. In such a manner, the transistor 5451 has a function of a switch or a selection transistor. The transistor 5451 is an n-channel transistor. For that reason, the transistor 5451 is turned on when an H-level signal is input to the wiring 5462, and is turned off when an L-level signal is input to the wiring 5462. Note that transistor 5451 is not limited to an n-channel transistor and can be a p-channel transistor. In that case, the transistor 5451 is turned on when an L-level signal is input to the wiring 5462, and is turned off when an H-level signal is input to the wiring 5462. The capacitor 5452 has a function of holding the potential difference between the electrode 5455 and the wiring 5463, and/or a function of keeping the potential of the electrode 5455 at a predetermined value. Thus, a voltage can continue to be applied to the display element 5453 even when the transistor 5451 is off. In such a manner, the capacitor 5452 has a function of a storage capacitor. Note that functions of the transistor 5451 and the capacitor 5452 are not limited to the above, and the transistor 5451 and the capacitor 5452 can have various other functions.

Next, the operation of the pixel in this embodiment will be roughly described. The gray level of the display element 5453 is controlled by applying a voltage to the display element 5453 so that an electric field is generated in the display element 5453. A voltage applied to the display element 5453 is controlled by controlling the potential of the electrode 5454 and the potential of the electrode 5455. Specifically, the potential of the electrode 5454 is controlled by controlling a voltage applied to the electrode 5454. The potential of the electrode 5455 is controlled by controlling a signal input to the wiring 5461. The signal input to the wiring 5461 is supplied to the electrode 5455 when the transistor 5451 is turned on.

Note that the gray level of the display element 5453 can be controlled by controlling at least one of the intensity of electric fields applied to the display element 5453, the direction of electric fields applied to the display element 5453, the time during which electric fields are applied to the display element 5453, and the like. Note that the gray level of the display element 5453 can be maintained by not generating a potential difference between the electrode 5454 and the electrode 5455.

Figure 15A:
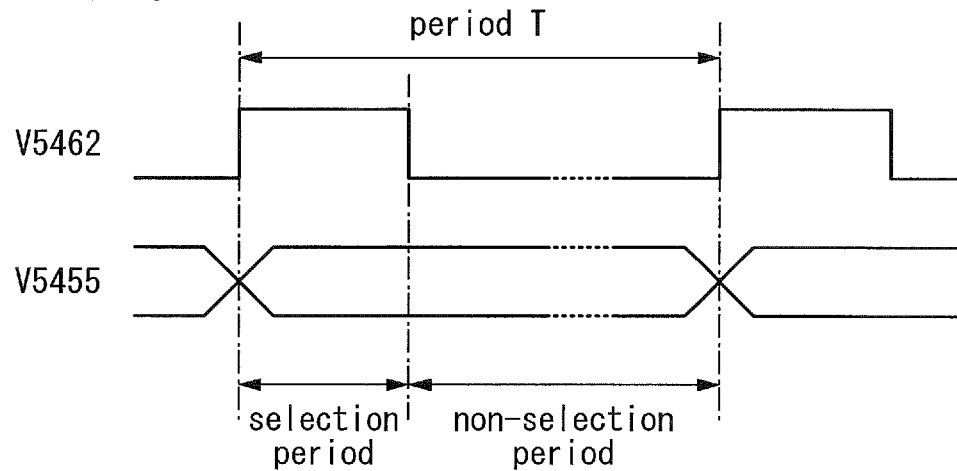
FIGS. 15A to 15C are timing charts each illustrating a waveform in a display device.

Next, an example of the operation of the pixel in this embodiment will be described. The timing chart in FIG. 15A shows a period T including a selection period and a non-selection period. The period T is a period from the start of a selection period until the start of the next selection period.

In the selection period, an H-level signal is input to the wiring 5462, so that the potential of the wiring 5462 (shown as a potential V5462) is at H level. For that reason, the transistor 5451 is turned on, so that electrical continuity is established between the wiring 5461 and the electrode 5455. Thus, a signal input to the wiring 5461 is supplied to the electrode 5455 through the transistor 5451, and the potential of the electrode 5455 (shown as a potential V5455) becomes a value equal to the signal input to the wiring 5461. At this time, the capacitor 5452 holds a potential difference between the electrode 5455 and the wiring 5463. In the non-selection period, an L-level signal is input to the wiring 5462, so that the potential of the wiring 5462 is at L level. For that reason, the transistor 5451 is turned off, and electrical continuity between the wiring 5461 and the electrode 5455 is broken. Then, the electrode 5455 is set in a floating state. At this time, the capacitor 5452 holds the potential difference between the electrode 5455 and the wiring 5463 in the selection period. For that reason, the potential of the electrode 5455 remains equal to the signal input to the wiring 5461 in the selection period. In such a manner, in the non-selection period, a voltage can continue to be applied to the display element 5453 even when the transistor 5451 is off. As described above, by controlling a signal input to the wiring 5461 in the selection period, a voltage applied to the display element 5453 can be controlled. That is, the gray level of the display element 5453 can be controlled by controlling a signal input to the wiring 5461 in the selection period.

The potential of the electrode 5455 in the non-selection period may be different from the signal input to the wiring 5461 in the selection period because of adverse effects of at least one of the off-state current of the transistor 5451, feedthrough of the transistor 5451, charge injection of the transistor 5451, and the like.

Figure 15B:
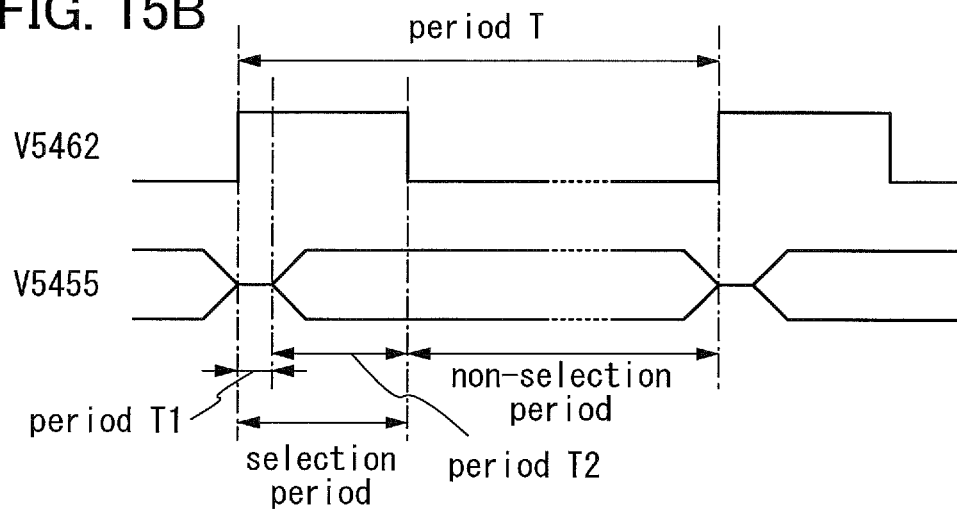

As illustrated in FIG. 15B, the potential of the electrode 5455 can be equal to that of the electrode 5454 in part of the selection period. Accordingly, even if the same signal continues to be input to the pixel 5450 every time the pixel 5450 is selected, the intensity of electric fields applied to the display element 5453 can be changed by changing the potential of the electrode 5455 in part of the selection period. Therefore, afterimages can be reduced; the response speed can be increased; or variations in response speed between pixels can be reduced so that unevenness or afterimages can be prevented. In order to realize such a driving method, the selection period is preferably divided into a period T1 and a period T2. In the period T1, the potential of the signal input to the wiring 5461 is preferably equal to that of the electrode 5454. In the period T2, the signal input to the wiring 5461 preferably has various values in order to control the gray level of the display element 5453. Note that when the period T1 is too long, the time during which a signal for controlling the gray level of the display element 5453 is written into the pixel 5450 becomes short. Therefore, the period T1 is preferably shorter than the period T2. Specifically, the period T1 accounts for preferably 1 to 20%, more preferably 3 to 15%, further preferably 5 to 10% of the selection period.

Figure 15C:
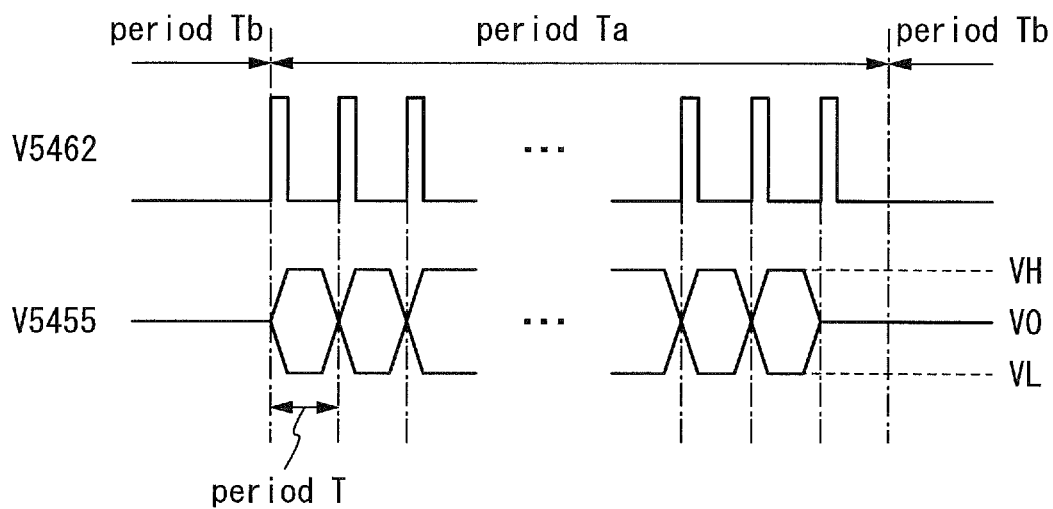

Next described is an example of the operation of the pixel in this embodiment, in which the gray level of the display element 5453 is controlled by the time during which a voltage is applied to the display element 5453. The timing chart in FIG. 15C shows a period Ta and a period Tb. The period Ta includes N periods T (N is a natural number). The N periods T are similar to the period T illustrated in FIG. 15A or FIG. 15B. The period Ta is a period for changing the gray level of the display element 5453 (e.g., an address period, a writing period, or an image rewriting period). The period Tb is a period during which the gray level of the display element 5453 in the period Ta is held (i.e., a holding period).

A voltage V0 is supplied to the electrode 5454, so that the electrode 5454 is at a potential V0. A signal having at least three values is input to the wiring 5461. Three potentials of the signal are a potential VH (VH>V0), the potential V0, and a potential VL (VL<V0). Accordingly, the potential VH, the potential V0, and the potential VL are applied to the electrode 5455.

In each of the N periods T in the period Ta, by controlling a potential applied to the electrode 5455, a voltage applied to the display element 5453 can be controlled.

For example, when the potential VH is applied to the electrode 5455, the potential difference between the electrode 5454 and the electrode 5455 becomes VH−VL. Thus, a positive voltage can be applied to the display element 5453. When the potential V0 is applied to the electrode 5455, the potential difference between the electrode 5454 and the electrode 5455 becomes zero. Thus, zero voltage can be applied to the display element 5453. When the potential VL is applied to the electrode 5455, the potential difference between the electrode 5454 and the electrode 5455 becomes VL−VH. Thus, a negative voltage can be applied to the display element 5453. As described above, in the period Ta, the positive voltage (VH−VL), the negative voltage (VL−VH), and zero voltage can be applied to the display element 5453 in a variety of orders. Thus, the gray level of the display element 5453 can be minutely controlled; afterimages can be reduced; or the response speed can be increased.

Note that in this embodiment, when a positive voltage is applied to the display element 5453, the gray level of the display element 5453 is close to black (also referred to as a first gray level). When a negative voltage is applied to the display element 5453, the gray level of the display element 5453 is close to white (also referred to as a second gray level). When zero voltage is applied to the display element 5453, the gray level of the display element 5453 is maintained.

In the period Tb, a signal input to the wiring 5461 is not written into the pixel 5450. Therefore, a potential applied to the electrode 5455 in the Nth period T in the period Ta continues to be applied in the period Tb. Specifically, in the period Tb, the gray level of the display element 5453 is preferably maintained by not generating electric fields in the display element 5453. For that reason, in the Nth period T in the period Ta, the potential V0 is preferably applied to the electrode 5455. Thus, the potential V0 is applied to the electrode 5455 also in the period Tb, so that zero voltage is applied to the display element 5453. In such a manner, the gray level of the display element 5453 can be maintained.

Note that as the gray level to be subsequently expressed by the display element 5453 is closer to the first gray level, the time during which the potential VH is applied to the electrode 5455 is preferably longer in the period Ta. Alternatively, the frequency of application of the potential VH to the electrode 5455 is preferably higher in the N periods T. Alternatively, in the period Ta, it is preferable to increase a time obtained by subtracting the time during which the potential VL is applied to the electrode 5455 from the time during which the potential VH is applied to the electrode 5455. Further alternatively, in the N periods T, it is preferable to increase a frequency obtained by subtracting the frequency of application of the potential VL to the electrode 5455 from the frequency of application of the potential VH to the electrode 5455.

In addition, as the gray level to be subsequently expressed by the display element 5453 is closer to the second gray level, the time during which the potential VL is applied to the electrode 5455 is preferably longer in the period Ta. Alternatively, the frequency of application of the potential VL to the electrode 5455 is preferably higher in the N periods T. Alternatively, in the period Ta, it is preferable to increase a time obtained by subtracting the time during which the potential VH is applied to the electrode 5455 from the time during which the potential VL is applied to the electrode 5455. Further alternatively, in the N periods T, it is preferable to increase a frequency obtained by subtracting the frequency of application of the potential VH to the electrode 5455 from the frequency of application of the potential VL to the electrode 5455.

In the period Ta, a combination of potentials (the potential VH, the potential V0, and the potential VL) applied to the electrode 5455 can depend not only on the gray level to be subsequently expressed by the display element 5453, but also on the gray level that has been expressed by the display element 5453. For that reason, if a different gray level has been expressed by the display element 5453, a combination of potentials applied to the electrode 5455 may vary even when the gray level to be subsequently expressed by the display element 5453 is the same.

For example, in the period Ta for expressing the gray level that has been expressed by the display element 5453, the time during which the potential VL is applied to the electrode 5455 is preferably longer in the period Ta in any of the following cases: the case where the time during which the potential VH is applied to the electrode 5455 is longer; the case where a time obtained by subtracting the time during which the potential VL is applied to the electrode 5455 from the time during which the potential VH is applied to the electrode 5455 is longer; the case where the frequency of application of the potential VH to the electrode 5455 is higher in the N periods T; or the case where a frequency obtained by subtracting the frequency of application of the potential VL to the electrode 5455 from the frequency of application of the potential VH to the electrode 5455 is higher in the N periods T. Alternatively, the frequency of application of the potential VL to the electrode 5455 is preferably higher in the N periods T. Alternatively, in the period Ta, it is preferable to increase a time obtained by subtracting the time during which the potential VH is applied to the electrode 5455 from the time during which the potential VL is applied to the electrode 5455. Further alternatively, in the N periods T, it is preferable to increase a frequency obtained by subtracting the frequency of application of the potential VH to the electrode 5455 from the frequency of application of the potential VL to the electrode 5455. In such a manner, afterimages can be reduced.

As another example, in the period Ta for expressing the gray level that has been expressed by the display element 5453, the time during which the potential VH is applied to the electrode 5455 is preferably longer in the period Ta in any of the following cases: the case where the time during which the potential VL is applied to the electrode 5455 is longer; the case where a time obtained by subtracting the time during which the potential VH is applied to the electrode 5455 from the time during which the potential VL is applied to the electrode 5455 is longer; the case where the frequency of application of the potential VL to the electrode 5455 is higher in the N periods T; or the case where a frequency obtained by subtracting the frequency of application of the potential VH to the electrode 5455 from the frequency of application of the potential VL to the electrode 5455 is higher in the N periods T. Alternatively, the frequency of application of the potential VH to the electrode 5455 is preferably higher in the N periods T. Alternatively, in the period Ta, it is preferable to increase a time obtained by subtracting the time during which the potential VL is applied to the electrode 5455 from the time during which the potential VH is applied to the electrode 5455. Further alternatively, in the N periods T, it is preferable to increase a frequency obtained by subtracting the frequency of application of the potential VL to the electrode 5455 from the frequency of application of the potential VH to the electrode 5455. In such a manner, afterimages can be reduced.

The N periods T have the same length; however, the length of the N periods T is not limited thereto and the lengths of at least two of the N periods T can be different from each other. It is particularly preferable that the length of the N periods T be weighted. For example, in the case where N is 4 and the length of the first period T is denoted by a time h, the length of the second period T is preferably a time h×2, the length of the third period T is preferably a time h×4, and the length of the fourth period T is preferably a time h×8. When the length of the N periods T is weighted in such a manner, the frequency of selection of the pixels 5450 can be reduced and the time during which a voltage is applied to the display element 5453 can be minutely controlled. Thus, power consumption can be reduced.

The potential VH and the potential VL can be selectively applied to the electrode 5454. In this case, it is preferable that the potential VH and the potential VL be selectively applied also to the electrode 5455. For example, in the case where the potential VH is applied to the electrode 5454, zero voltage is applied to the display element 5453 when the potential VH is applied to the electrode 5455, whereas a negative voltage is applied to the display element 5453 when the potential VL is applied to the electrode 5455. On the other hand, in the case where the potential VL is applied to the electrode 5454, a positive voltage is applied to the display element 5453 when the potential VH is applied to the electrode 5455, whereas zero voltage is applied to the display element 5453 when the potential VL is applied to the electrode 5455. In such a manner, the signal input to the wiring 5461 can have two values (i.e., the signal can be a digital signal). For that reason, it is possible to simplify a circuit that outputs a signal to the wiring 5461.

In the period Tb or part of the period Tb, it is possible not to input a signal to the wiring 5461 and the wiring 5462. That is, the wiring 5461 and the wiring 5462 can be set in a floating state. Moreover, in the period Tb or part of the period Tb, it is possible not to input a signal to the wiring 5463. That is, the wiring 5463 can be set in a floating state. Furthermore, in the period Tb or part of the period Tb, it is possible not to supply a voltage to the electrode 5454. That is, the electrode 5454 can be set in a floating state.

Embodiment 7

In this embodiment, examples of electronic devices will be described.

FIGS. 16A to 16H and FIGS. 17A to 17D each illustrate an electronic device. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 16A:
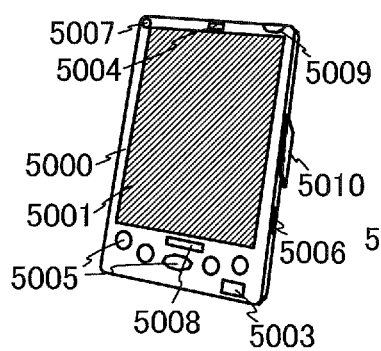
FIGS. 16A to 16H each illustrate an electronic device.
Figure 16B:
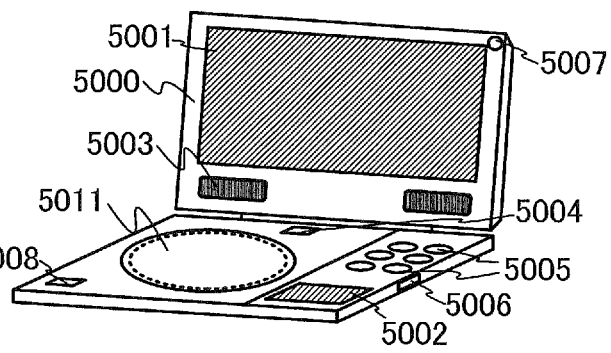
Figure 16C:
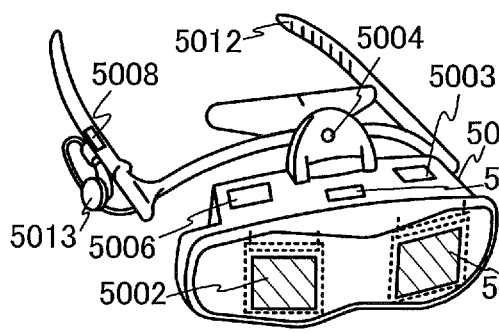
Figure 16D:
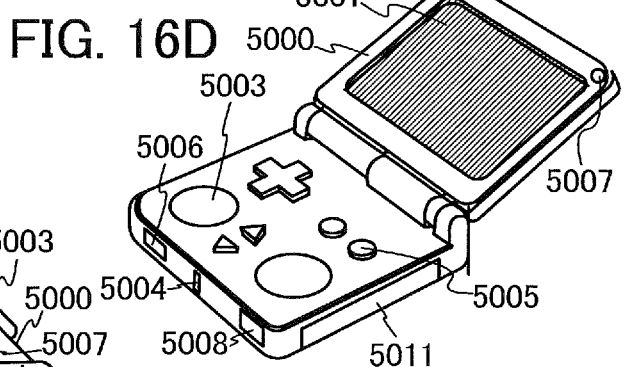
Figure 16E:
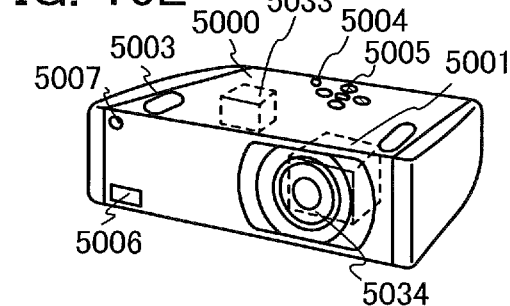
Figure 16F:
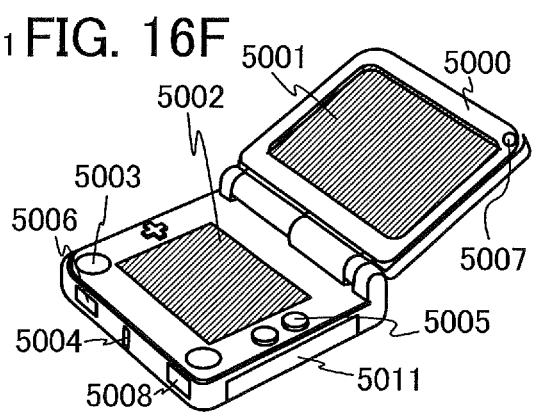
Figure 16G:
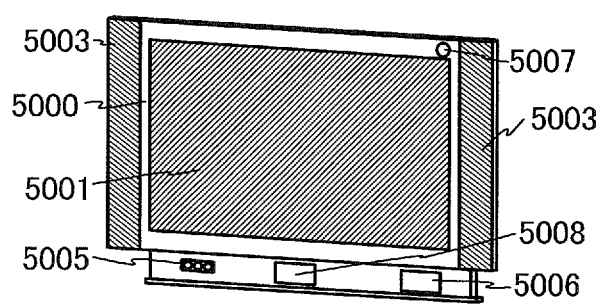
Figure 16H:
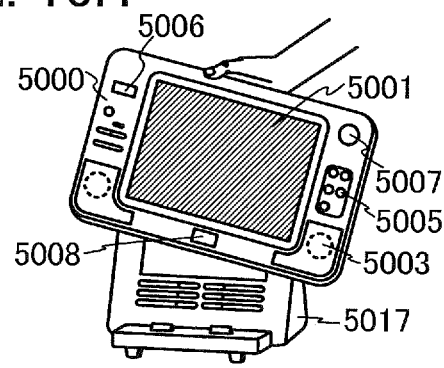
Figure 17A:
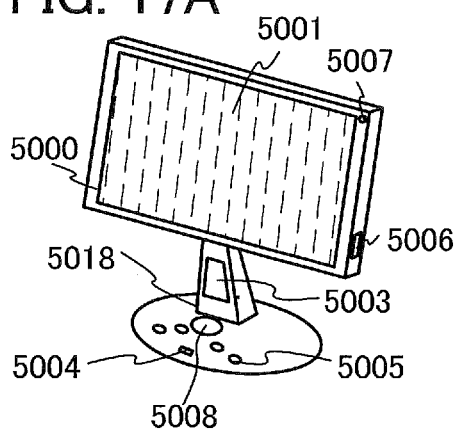
FIGS. 17A to 17H each illustrate an electronic device.
Figure 17B:
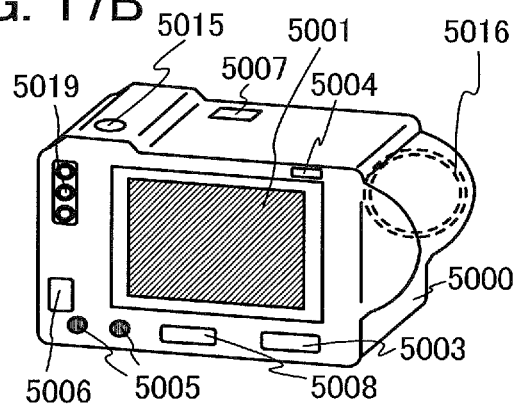
Figure 17C:
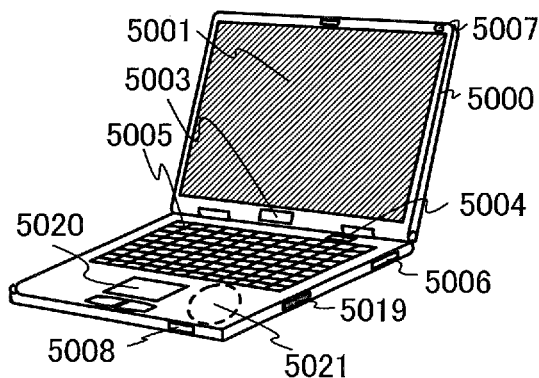
Figure 17D:
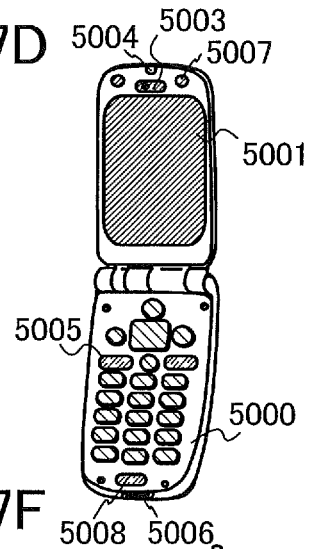

FIG. 16A illustrates a mobile computer that can include a switch 5009, an infrared port 5010, and the like in addition to the above-described components. FIG. 16B illustrates a portable image reproducing device (e.g., a DVD reproducing device) provided with a memory medium, and the image reproducing device can include a second display portion 5002, a memory medium reading portion 5011, and the like in addition to the above components. FIG. 16C illustrates a goggle-type display that can include second display portion 5002, a support portion 5012, an earphone 5013, and the like in addition to the above components. FIG. 16D illustrates a portable game machine that can include the memory medium reading portion 5011 and the like in addition to the above components. FIG. 16E illustrates a projector that can include a light source 5033, a projector lens 5034, and the like in addition to the above components. FIG. 16F illustrates a portable game machine that can include the second display portion 5002, the memory medium reading portion 5011, and the like in addition to the above components. FIG. 16G illustrates a television set that can include a tuner, an image processing portion, and the like in addition to the above components. FIG. 16H illustrates a portable television receiver that can include a charger 5017 capable of transmitting and receiving signals and the like in addition to the above components. FIG. 17A illustrates a display that can include a support base 5018 and the like in addition to the above-described components. FIG. 17B illustrates a camera that can include an external connection port 5019, a shutter button 5015, an image receiving portion 5016, and the like in addition to the above components. FIG. 17C illustrates a computer that can include a pointing device 5020, the external connection port 5019, a reader/writer 5021, and the like in addition to the above components. FIG. 17D illustrates a mobile phone that can include an antenna 5014, a tuner of one-segment (1seg digital TV broadcasts) partial reception service for mobile phones and mobile terminals, and the like in addition to the above components.

The electronic devices illustrated in FIGS. 16A to 16H and FIGS. 17A to 17D can have a variety of functions.

The electronic device described in this embodiment includes a display portion for displaying some kind of information.

Next, applications of a semiconductor device will be described.

Figure 17E:
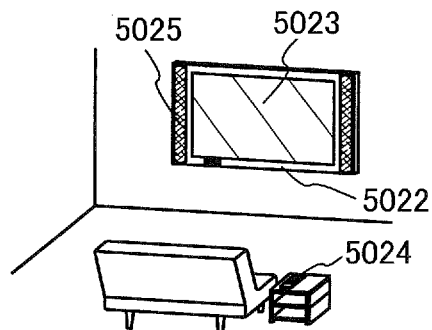

FIG. 17E illustrates an example in which a semiconductor device is incorporated in a building structure. FIG. 17E illustrates a housing 5022, a display portion 5023, a remote controller 5024 which is an operation portion, a speaker 5025, and the like. The semiconductor device is incorporated in the building as a wall-hanging type and can be provided without requiring a large space.

Figure 17F:
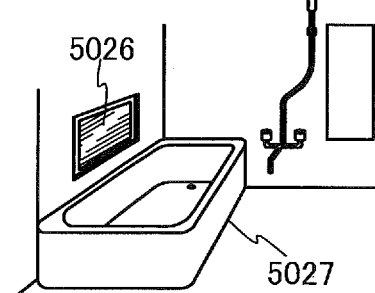

FIG. 17F illustrates another example in which a semiconductor device is incorporated in a building. A display panel 5026 is integrated with a prefabricated bath 5027, so that a person who takes a bath can watch the display panel 5026.

Note that although the wall and the prefabricated bath are given as examples of the building, this embodiment is not limited to these examples and the semiconductor device can be provided in a variety of buildings.

Next, examples in which a semiconductor device is incorporated with a moving object will be described.

Figure 17G:
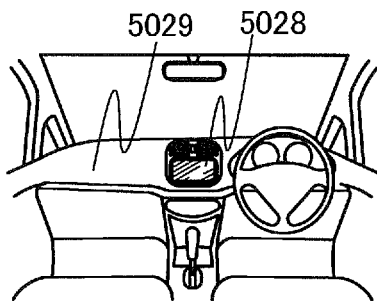

FIG. 17G illustrates an example in which a semiconductor device is provided in a car. A display panel 5028 is provided in a body 5029 of the car and can display information related to the operation of the car or information input from inside or outside of the car on demand. Note that a navigation function may be provided.

Figure 17H:
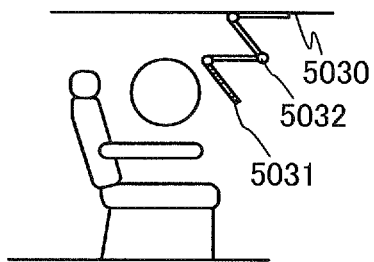

FIG. 17H illustrates an example in which a semiconductor device is incorporated in a passenger airplane. FIG. 17H shows a usage pattern when a display panel 5031 is provided for a ceiling 5030 above a seat of the airplane. The display panel 5031 is integrated with the ceiling 5030 through a hinge portion 5032, and a passenger can watch the display panel 5031 by extending and contracting the hinge portion 5032. The display panel 5031 has a function of displaying information when operated by the passenger.

Note that although the body of the car and the body of the plane are given as examples of the moving body, this embodiment is not limited to these examples. The display device can be provided for a variety of moving bodies such as a two-wheel motor vehicle, a four-wheel vehicle (including a car, bus, and the like), a train (including a monorail, a railway, and the like), and a ship.

In such an electronic device, the formation of a circuit with the use of a transistor that includes an oxide semiconductor and has a low off-state current can prevent unnecessary current from being leaked into the circuit. For that reason, the circuit is likely to operate normally. As a result, accurate display can be performed.

This application is based on Japanese Patent Application serial no. 2010-028285 filed with Japan Patent Office on Feb. 11, 2010, the entire contents of which are hereby incorporated by reference.

What is claimed is:

1. A display device comprising:
a pixel portion including a plurality of first transistors; and
a circuit including a plurality of second transistors, the circuit being configured to inspect whether the plurality of the first transistors normally operate or not,
wherein channel formation regions of the plurality of the first transistors and the plurality of the second transistors include oxide semiconductor,
wherein gate electrodes of the plurality of the second transistors are electrically connected to a first wiring,
wherein the first wiring includes at least three lines, and signals are configured to be supplied to the at least three lines at different timings,
wherein source or drain electrodes of the plurality of the second transistors are electrically connected to a second wiring,
wherein a channel width of the plurality of the second transistors is larger than a channel width of the plurality of the first transistors, and
wherein an off-state current per channel width of 1 µm of the plurality of the first transistors and the plurality of the second transistors is 100 aA or less.

2. The display device according to claim 1, wherein each of the first wiring and the second wiring is in a floating state.

3. The display device according to claim 1, wherein the first wiring and the second wiring extend in parallel with each other.

* * * * *